(12) United States Patent
Kawaguchi et al.

(10) Patent No.: US 10,317,442 B2
(45) Date of Patent: Jun. 11, 2019

(54) CAPACITIVE SENSOR, SENSOR SHEET, AND METHOD FOR MANUFACTURING CAPACITIVE SENSOR

(71) Applicant: Sumitomo Riko Company Limited, Aichi-ken (JP)

(72) Inventors: Junya Kawaguchi, Aichi-ken (JP); Tomohiro Fujikawa, Aichi-ken (JP); Yutaro Taguchi, Aichi-ken (JP); Hiroshi Yamada, Aichi-ken (JP)

(73) Assignee: SUMITOMO RIKO COMPANY LIMITED, Aichi-Ken (JP)

( * ) Notice: Subject to any disclaimer, the term of this patent is extended or adjusted under 35 U.S.C. 154(b) by 197 days.

(21) Appl. No.: 15/652,615

(22) Filed: Jul. 18, 2017

(65) Prior Publication Data
US 2017/0315165 A1    Nov. 2, 2017

Related U.S. Application Data

(63) Continuation of application No. PCT/JP2016/055402, filed on Feb. 24, 2016.

(30) Foreign Application Priority Data

Jul. 31, 2015  (JP) .................................. 2015-152447

(51) Int. Cl.
*G01D 5/24* (2006.01)
*G01L 1/14* (2006.01)
(Continued)

(52) U.S. Cl.
CPC ........... *G01R 27/2605* (2013.01); *G01D 5/24* (2013.01); *G01L 1/14* (2013.01); *G01L 5/00* (2013.01);
(Continued)

(58) Field of Classification Search
CPC ...... G01D 5/24; G01R 27/2605; G06F 3/044; G06F 3/0414; G06F 2203/04103;
(Continued)

(56) References Cited

U.S. PATENT DOCUMENTS 7,430,925 B2   10/2008   Son et al.
9,237,645 B2    1/2016   Kido et al.
(Continued)

FOREIGN PATENT DOCUMENTS

JP    S63-301593    12/1988
JP    H05-33560     4/1993
(Continued)

OTHER PUBLICATIONS

Office Action issued in Taiwan Patent Appl. No. 10620676890 dated Jun. 28, 2017, along with a partial English translation thereof.
(Continued)

*Primary Examiner* — Amy He
(74) *Attorney, Agent, or Firm* — Greenblum & Bernstein, P.L.C.

(57) ABSTRACT

Provided is a flexible, durable capacitive sensor that achieves high flexibility in designing wiring arrangement. A capacitive sensor includes a dielectric layer and a plurality of electrode units placed on both sides of the dielectric layer in the front-back direction. The electrode unit includes an insulating layer having through holes extending therethrough in the front-rear direction, electrode layers placed on one side of the insulating layer in the front-back direction, and jumper wiring layers placed on the other side of the insulating layer in the front-back direction and electrically connected to the electrode layers through the through holes. The insulating layer has an elongation at break of 60% or more, a tension set of less than 5%, and a volume resistivity of $1.0 \times 10^{10}$ Ω·cm or more.

15 Claims, 15 Drawing Sheets

(51) Int. Cl.
*G01L 5/00* (2006.01)
*G01R 27/26* (2006.01)
*G06F 3/041* (2006.01)
*G06F 3/044* (2006.01)
*B60R 21/015* (2006.01)

(52) U.S. Cl.
CPC ............ *G01L 5/0014* (2013.01); *G06F 3/044* (2013.01); *G06F 3/0414* (2013.01); *B60R 21/01532* (2014.10); *G06F 2203/04103* (2013.01)

(58) Field of Classification Search
CPC ........... G01L 5/00; G01L 5/0014; G01L 1/14; B60R 21/01532
USPC .......................... 324/661, 663; 345/173, 174
See application file for complete search history.

(56) References Cited

U.S. PATENT DOCUMENTS

2010/0220071 A1* 9/2010 Nishihara ............ G06F 3/0416
　　　　　　　　　　　　　　　　　　　　　345/173
2015/0301603 A1* 10/2015 Maggiali ................ G06F 3/044
　　　　　　　　　　　　　　　　　　　　　345/174

FOREIGN PATENT DOCUMENTS

| JP | 2013-096716 | 5/2013 |
| TW | 200716994 | 5/2007 |
| TW | 201142677 | 12/2011 |
| WO | 2012/147870 | 11/2012 |

OTHER PUBLICATIONS

International Preliminary Report on Patentability for International Application No. PCT/JP2016/055402 dated Feb. 15, 2018 along with the English language translation.

* cited by examiner

FIG. 7

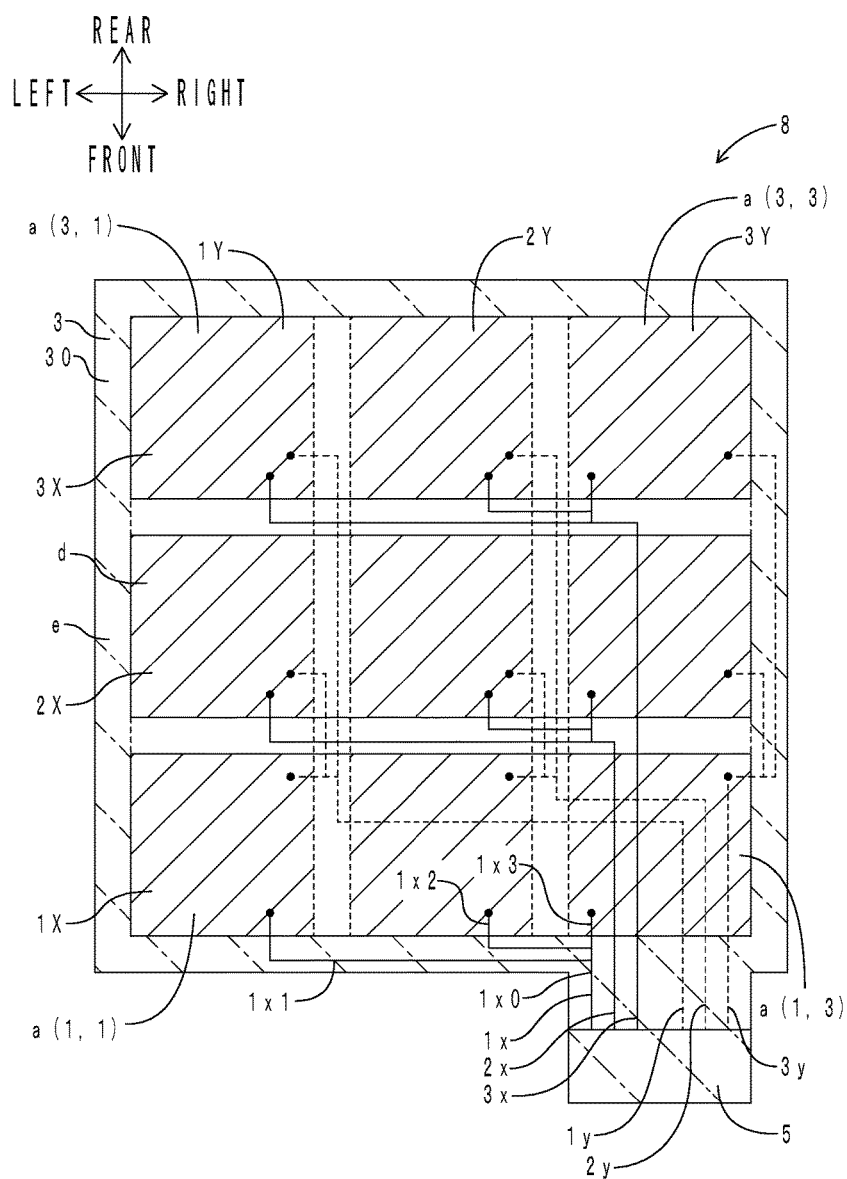
F I G. 11

CAPACITIVE SENSOR, SENSOR SHEET, AND METHOD FOR MANUFACTURING CAPACITIVE SENSOR

INCORPORATION BY REFERENCE

The disclosure of Japanese Patent Application No. 2015-152447 filed on Jul. 31, 2015 including the specification, drawings and abstract is incorporated herein by reference in its entirety.

BACKGROUND OF THE INVENTION

1. Field of the Invention

The present invention relates to capacitive sensors that can detect a load based on a change in capacitance, sensor sheets, and methods for manufacturing a capacitive sensor.

2. Description of Related Art

For example, Japanese Patent Application Publication No. 2013-096716 (JP 2013-096716 A) discloses a capacitive sensor including a dielectric layer and a plurality of front-side electrode layers and a plurality of back-side electrode layers which are disposed with the dielectric layer interposed therebetween. FIG. 12 is a transparent top view of the capacitive sensor disclosed in JP 2013-096716 A. As shown in FIG. 12, a capacitive sensor 9 includes a dielectric layer 90, front-side electrode layers 01X to 08X, back-side electrode layers 01Y to 08Y, front-side wiring layers 01x to 08x, and back-side wiring layers 01y to 08y. The front-side wiring layers 01x to 08x are connected to the left ends of the front-side electrode layers 01X to 08X, respectively. The back-side wiring layers 01y to 08y are connected to the front ends of the back-side electrode layers 01Y to 08Y. A plurality of detection units are formed in portions (right-slanted hatched areas in the figure) where the front-side electrode layers 01X to 08X and the back-side electrode layers 01y to 08Y overlap each other as viewed from above (from the front side of the dielectric layer 90).

When a load is applied to the capacitive sensor 9, the thickness of those detection units which correspond to the part of the capacitive sensor 9 which has been subjected to the load is reduced. Namely, the distance between the front-side electrode layer 01X to 08X and the back-side electrode layer 01Y to 08Y is reduced in this part of the capacitive sensor 9. Capacitance of the detection units is thus increased. The capacitive sensor 9 can thus measure load distribution based on a change in capacitance which is caused by a change in distance between the electrodes.

In the conventional capacitive sensor 9, as shown in FIG. 12, the front-side electrode layers 01X to 08X and the front-side wiring layers 01x to 08x are formed on the same plane. Similarly, the back-side electrode layers 01Y to 08Y and the back-side wiring layers 01y to 08y are formed on the same plane. Accordingly, on both the front and back sides of the capacitive sensor 9, the wiring layers are formed in a peripheral portion having no electrode layer formed therein so that none of the wiring layers will be electrically connected to any of the electrode layers that are not connected thereto. A region where only the wiring layers are disposed is a dead region where a load cannot be detected. Since the dead region is required in addition to a pressure sensitive region where a load is detected, the size and weight of the sensor are increased accordingly. The presence of the dead region is therefore disadvantageous in the case where reduction in size and weight is required, such as in the case where the sensor is used in a limited space. Moreover, since the manner in which the wiring layers are arranged is limited, flexibility in designing the sensor shape is reduced.

For example, in the field of printed circuit boards etc., a three-dimensional wiring structure is known in which wires are arranged three-dimensionally with an insulating layer interposed therebetween (see, e.g., Japanese Utility-Model Application Publication No. H05-33560, Japanese Patent Application Publication No. S63-301593, and International Patent Publication No. 2012/147870). However, many of insulating layers used for printed circuit boards are made of an epoxy resin etc. and are therefore poor in flexibility. In the above capacitive sensor, the electrode layers and the wiring layers are made of flexible conductive materials so that they can be extended when subjected to a load. Therefore, if such a three-dimensional wiring structure having an insulating layer that is poor in flexibility is used in the above capacitive sensor, extension and contraction of the electrode layers and the wiring layers are restricted by the insulating layer. Moreover, the insulating layer may delaminate or fracture by repeated extension and contraction, which significantly increase electrical resistance when the insulating layer is extended. The capacitive sensor therefore may not function as a sensor.

SUMMARY OF THE INVENTION

The present invention was developed in view of the above circumstances, and it is an object of the present invention to provide a flexible, highly durable capacitive sensor and sensor sheet with high flexibility in designing wiring arrangement. It is also an object of the present invention to provide a method for manufacturing such a capacitive sensor.

(1) In order to achieve the above object, a capacitive sensor according to the present invention includes a dielectric layer and a plurality of electrode units placed on both sides of the dielectric layer in a front-back direction. The electrode unit includes an insulating layer having a through hole extending therethrough in the front-back direction, an electrode layer placed on one side of the insulating layer in the front-back direction, and a jumper wiring layer placed on the other side of the insulating layer in the front-back direction and electrically connected to the electrode layer through the through hole. The insulating layer has an elongation at break of 60% or more and a tension set of less than 5%, and a volume resistivity of $1.0 \times 10^{10}$ Ω·cm or more.

The electrode unit forming the capacitive sensor of the present invention has a three-dimensional wiring structure in which the electrode layer and the jumper wiring layer are not arranged on the same plane but are arranged three-dimensionally with the insulating layer interposed therebetween. The electrode layer and the jumper wiring layer are electrically connected to each other via the through hole in the insulating layer. The through hole may be filled with the electrode layer, may be filled with the jumper wiring layer, or may be filled with both the electrode layer and the jumper wiring layer. With the three-dimensional wiring structure, the jumper wiring layer can be placed so as to overlap the electrode layer as viewed from a front side or a back side of the insulating layer. This configuration can reduce the size of a dead region where only the jumper wiring layer is placed, and can therefore make it easier to reduce the size and weight of the capacitive sensor. Moreover, the jumper wiring layer can not only be connected to an end of the electrode layer but also connected to the electrode layer at any position on the electrode layer. That is, the jumper wiring layer can be connected to a desired part of the electrode layer. This configuration improves flexibility in designing arrangement of the wiring layers and flexibility in designing the sensor shape.

The insulating layer has an elongation at break of 60% or more and a tension set of less than 5%. That is, the insulating layer is flexible and can be easily extended, and settling of the insulating layer is less likely to occur. The insulating layer therefore extends and contracts in accordance with elastic deformation of the electrode layer, and is less likely to delaminate or fracture even after repeated extension and contraction. The capacitive sensor of the present invention is therefore flexible and highly durable.

As used herein, the elongation at break is a value of elongation of a material when it is broken, which is measured by a tensile test defined in JIS K6251:2010. The tensile test is performed with test pieces of dumbbell shape No. 5 at a tensile speed of 100 mm/min. The tension set is a value of tension set under constant elongation which is measured by a tension set test under constant elongation defined in JIS K6273:2006. The tension set test under constant elongation is performed with test pieces of dumbbell shape No. 5 defined in JIS K6251:2010, and the test pieces are extended to an elongation of 50% and held in this extended state at room temperature for 30 seconds. The volume resistivity is a value that is measured based on a method defined in JIS K6911:1995.

(2) Preferably, in the configuration of (1), the insulating layer has a tensile modulus of greater than 10 MPa.

As described above, the insulating layer is flexible and is highly extensible. Accordingly, in the case of forming such an insulating layer by screen printing, a coating material for forming the insulating layer is tackier and a coating film may stick to (block) printing plate. In the above configuration, however, in the case of forming the insulating layer having a tensile modulus of greater than 10 MPa, a coating material for forming the insulating layer is not so tacky and a coating film is less likely to stick to a printing plate during printing. This achieves improved printing accuracy, a higher yield, and improved work performance. As used herein, the tensile modulus is a value that is calculated from a stress-elongation curve obtained by a tensile test defined in JIS K7127:1999. The tensile test is performed with Type 2 test pieces at a tensile speed of 100 mm/min.

(3) Preferably, in the configuration of (1) or (2), the insulating layer contains an elastomer and an anti-blocking agent.

The elastomer includes a crosslinked rubber and a thermoplastic elastomer. Adding the anti-blocking agent provides unevenness of the surface of the insulating layer and thus can increase surface roughness of the insulating layer. Tackiness of the coating material for forming the insulating layer and the tensile modulus of the insulating layer can be adjusted by the content of the anti-blocking agent. The coating film is thus less likely to stick to the printing plate in the case of forming the insulating layer by screen printing.

(4) Preferably, in the configuration of (3), the insulating layer contains 18 parts by mass or more and less than 107 parts by mass of the anti-blocking agent per 100 parts by mass of the elastomer.

Higher content of the anti-blocking agent more restrains the coating film from sticking to the printing plate, but may reduce the elongation at brake of the insulating layer or may increase the tension set of the insulating layer, which may result in reduced adhesion between the electrode layer and the jumper wiring layer. On the other hand, lower content of the anti-blocking agent does not sufficiently restrain the coating film from sticking to the printing plate. The above configuration can restrain sticking of the coating film of the insulating layer to the printing plate and achieve extensibility and adhesion of the insulating layer to a mating member.

(5) Preferably, in the configuration of (3) or (4), the anti-blocking agent contains at least either titanium oxide particles or silica particles.

(6) Preferably, in the configuration of any one of (1) to (5), the electrode unit has a substrate, and the insulating layer, the electrode layer, and the jumper wiring layer are formed on one side of the substrate in the front-back direction.

In the above configuration, the insulating layer, the electrode layer, and the jumper wiring layer are formed in advance on the one side of the substrate, and the dielectric layer is interposed between at least one pair of substrates with the substrates facing outward. The electrode unit can thus be easily placed on both sides of the dielectric layer in the front-back direction even in the case where it is difficult to form the electrode layer and the jumper wiring layer directly on both front and back surfaces of the dielectric layer.

(7) Preferably, in the configuration of any one of (1) to (6), the electrode layer and the jumper wiring layer contain an elastomer.

With the above configuration, the electrode layer and the jumper wiring layer are flexible and highly extendable and contractible. The electrode unit including the insulating layer therefore tends to elastically deform in accordance with elastic deformation of the dielectric layer. This improves overall flexibility and durability of the sensor.

(8) Preferably, in the configuration of any one of (1) to (7), the electrode unit placed on a front side of the dielectric layer is a front-side electrode unit, and the electrode unit placed on a back side of the dielectric layer is a back-side electrode unit. In the front-side electrode unit, the electrode layer is formed by a plurality of front-side electrode layers arranged parallel to each other, and the jumper wiring layer is formed by a plurality of front-side wiring layers electrically connected to the plurality of front-side electrode layers. In the back-side electrode unit, the electrode layer is formed by a plurality of back-side electrode layers arranged parallel to each other, and the jumper wiring layer is formed by a plurality of back-side wiring layers electrically connected to the plurality of back-side electrode layers. The plurality of front-side electrode layers and the plurality of back-side electrode layers extend in such a direction that the plurality of front-side electrode, layers cross the plurality of back-side electrode layers, and a plurality of detection units are formed in portions where the plurality of front-side electrode layers overlap the plurality of back-side electrode layers, as viewed from a front side or a back side.

With the above configuration, a load can be detected in the plurality of detection units. Load distribution in a planar direction of the capacitive sensor (a direction perpendicular to the front-back direction) can thus be measured.

(9) A method for manufacturing the capacitive sensor having the configuration of (6) includes: an electrode unit producing step of producing the electrode unit; and a placing step of placing the electrode unit on both sides of the dielectric layer in the front-back direction such that the substrate faces outward. The electrode unit producing step includes a first printing step of forming one of the electrode layer and the jumper wiring layer on one side of the substrate in the front-back direction by a printing method, a second printing step of forming the insulating layer by a printing method such that the insulating layer covers the printed electrode layer or jumper wiring layer, and a third printing step of forming the other of the electrode layer and the jumper wiring layer by a printing method such that the other of the electrode layer and the jumper wiring layer covers the through hole in the insulating layer.

The method for manufacturing the capacitive sensor of the present invention is a method for manufacturing a capacitive sensor including an electrode unit having a substrate. According to the manufacturing method of the present invention, the electrode layer, the jumper wiring layer, and the insulating layer can be easily formed on one side of the substrate in the front-back direction. The dielectric layer is sandwiched between the plurality of produced electrode units. The capacitive sensor can thus be easily manufactured.

With the printing method, the electrode layer and the jumper wiring layer can be easily formed even when the electrode layer and the jumper wiring layer are thin or have a large area. In the printing method, it is easy to coat only those portions that should be coated and not to coat those portions that should not be coated. Accordingly, the electrode layer and the jumper wiring layer can be easily formed even if the electrode layer and the jumper wiring layer are thin lines or have a complicated shape. Examples of the printing method include ink jet printing, flexography, gravure, screen printing, pad printing, and lithography.

(10) Preferably, in the configuration of (9), the printing method in the first printing step, the second printing step, and the third printing step is screen printing.

A relatively viscous coating material can be used in the screen printing. It is therefore easy to adjust the coating thickness and to form a layer with a relatively great tensile modulus. Moreover, in the screen printing, it is easy to form a film with a large area or a thick film, and high dimensional accuracy can be achieved when coating more layers.

(11) In order to achieve the above object, a sensor sheet of the present invention is a sensor sheet including the capacitive sensor with the configuration of (8). The sensor sheet includes, as viewed from a front side or a back side: a pressure sensitive region where the plurality of detecting units are formed; and a dead region placed next to the pressure sensitive region in a planar direction, and having an extended portion from which an amount of electricity regarding capacitance of the plurality of detection units can be obtained from outside. The insulating layer of the front-side electrode unit is a front-side insulating layer placed on a front side of the front-side electrode layer. The through hole extending through the front-side insulating layer is a front-side through hole. The insulating layer of the back-side electrode unit is a back-side insulating layer placed on a back side of the back-side electrode layer. The through hole extending through the back-side insulating layer is a back-side through hole. The front-side wiring layer is placed on a front side of the front-side insulating layer and electrically connects the front-side electrode layer and the extended portion via the front-side through hole. The back-side wiring layer is placed on a back side of the back-side insulating layer and electrically connects the back-side electrode layer and the extended portion via the back-side through hole. A front-side detection path running through at least the front-side wiring layer and a back-side detection path running through at least the back-side wiring layer are formed between each of the plurality of detection units the extended portion. A sensor body having at least one of the detection units, the extended portion, and the front-side detection path and the back-side detection path for the detection unit can be cut from the sensor sheet. The number of detection units that are placed in the capacitive sensor with the configuration of (8) may not be the same as that of sensor bodies that are cut from the sensor sheet of the present invention.

The sensor body includes at least one of the detection units, the extended portion, and the front-side detection path and the back-side detection path for the detection unit. Accordingly, a sensor body with a desired shape etc., namely a capacitive sensor, can be cut from the sensor sheet with a predetermined shape etc. (e.g., shape, area, etc.). Accordingly, even when a plurality of capacitive sensors with different shapes etc. are required, it is not necessary to design and produce dedicated members for the capacitive sensors (e.g., printing plates in the case where the capacitive sensors are manufactured by printing, molds in the case where the capacitive sensors are manufactured by molding, etc.) according to the desired shapes etc. of the capacitive sensors. That is, sensor bodies need only be cut from the sensor sheet according to the desired shapes etc. of the capacitive sensors. Manufacturing cost of the capacitive sensors can thus be reduced. In particular, manufacturing cost can be reduced in the case of manufacturing many models of capacitive sensors in small quantities or in the case of manufacturing prototypes of the capacitive sensors.

In the case of the sensor sheet of the present invention, the front-side wiring layer is connected from the front side to the front-side electrode layer via the front-side through hole. Similarly, the back-side wiring layer is connected from the back side to the back-side electrode layer via the back-side through hole. The sensor body cut from the sensor sheet is therefore less likely to have a detection unit that cannot detect a load. Flexibility in designing the cut shape of the sensor body can thus be increased.

In the case of the sensor sheet of the present invention, the front-side wiring layer and the front-side electrode layer can be disposed so as to overlap each other in the front-back direction with the front-side insulating layer interposed therebetween. Similarly, the back-side wiring layer and the back-side electrode layer can be disposed so as to overlap each other in the front-back direction with the back-side insulating layer interposed therebetween. The proportion of the dead region to the entire sensor sheet can thus be reduced. That is, the proportion of the dead region to the entire sensor body cut from the sensor sheet can be reduced.

(12) Preferably, in the configuration of (11), a contact between the front-side wiring layer and the front-side electrode layer is a front-side contact, a contact between the back-side wiring layer and the back-side electrode layer is a back-side contact, a plurality of the back-side contacts are placed so as to overlap the front-side electrode layer closest to the extended portion, as viewed from the front side or the back side, and a plurality of the front-side contacts are placed so as to overlap the back-side electrode layer closest to the extended portion, as viewed from the front side or the back side.

With the above configuration, the front-side wiring layer and the back-side wiring layer can be placed near the extended portion. The front-side wiring layer and the back-side wiring layer are therefore less likely to be cut when the sensor body is cut from the sensor sheet. Flexibility in designing the cut shape of the sensor body can thus be increased.

(13) Preferably, in the configuration of (11), a contact between the front-side wiring layer and the front-side electrode layer is a front-side contact, a contact between the back-side wiring layer and the back-side electrode layer is a back-side contact, and the front-side contact and the back-side contact are individually placed in all of the detection units.

With the above configuration, every detection unit is directly connected to the front-side wiring layer and the back-side wiring layer. Accordingly, even if the front-side electrode layer or the back-side electrode layer is cut when the sensor body is cut from the sensor sheet, the front-side detection path and the back-side detection path for the detection units of the sensor body can be more easily ensured.

(14) in order to achieve the above object, a capacitive sensor of the present invention includes: a sensor body cut from the sensor sheet in the configuration of any one of (11) to (13); and a control unit that is electrically connected to the extended portion and that, in a case where the sensor body has the detection unit that has been partially cut away, corrects the amount of electricity regarding the capacitance of the detection unit.

According to the capacitive sensor of the present invention, in the case where the sensor body cut from the sensor sheet has the detection unit that has been partially cut away, the control unit can correct the amount of electricity regarding the capacitance of the detection unit. Accuracy of detection of load distribution can thus be improved.

(15) A method for manufacturing the capacitive sensor in the configuration of (14) includes: a cutting step of cutting the sensor body from the sensor sheet. The front-side wiring layer of the sensor sheet is connected from the front side to the front-side electrode layer via the front-side through hole. Similarly, the back-side wiring layer of the sensor sheet is connected from the back side to the back-side electrode layer via the back-side through hole. The sensor body cut from the sensor sheet is therefore less likely to have a detection unit that cannot detect a load. Flexibility in designing the cut shape of the sensor body in the cutting step can thus be increased.

The present invention can provide a flexible, durable capacitive sensor and sensor sheet with high flexibility in designing wiring arrangement. The present invention can also provide a method for manufacturing this capacitive sensor.

BRIEF DESCRIPTION OF THE DRAWINGS

FIG. 7 is a sectional view taken along line VII-VII in FIG. 6;

FIG. 11 is a transparent top view of a sensor sheet of a third embodiment; and

DETAILED DESCRIPTION OF THE EMBODIMENTS

Embodiments of a capacitive sensor, a sensor sheet, and a method for manufacturing a capacitive sensor according to the present invention will be described below. In the following figures, the upper side corresponds to the "front side" of the present invention, and the lower side corresponds to the "back side" of the present invention. At least one of the forward, rearward, rightward, and leftward directions corresponds to the "planar direction" of the present invention.

First Embodiment

<Configuration of Capacitive Sensor>

Figure 1:
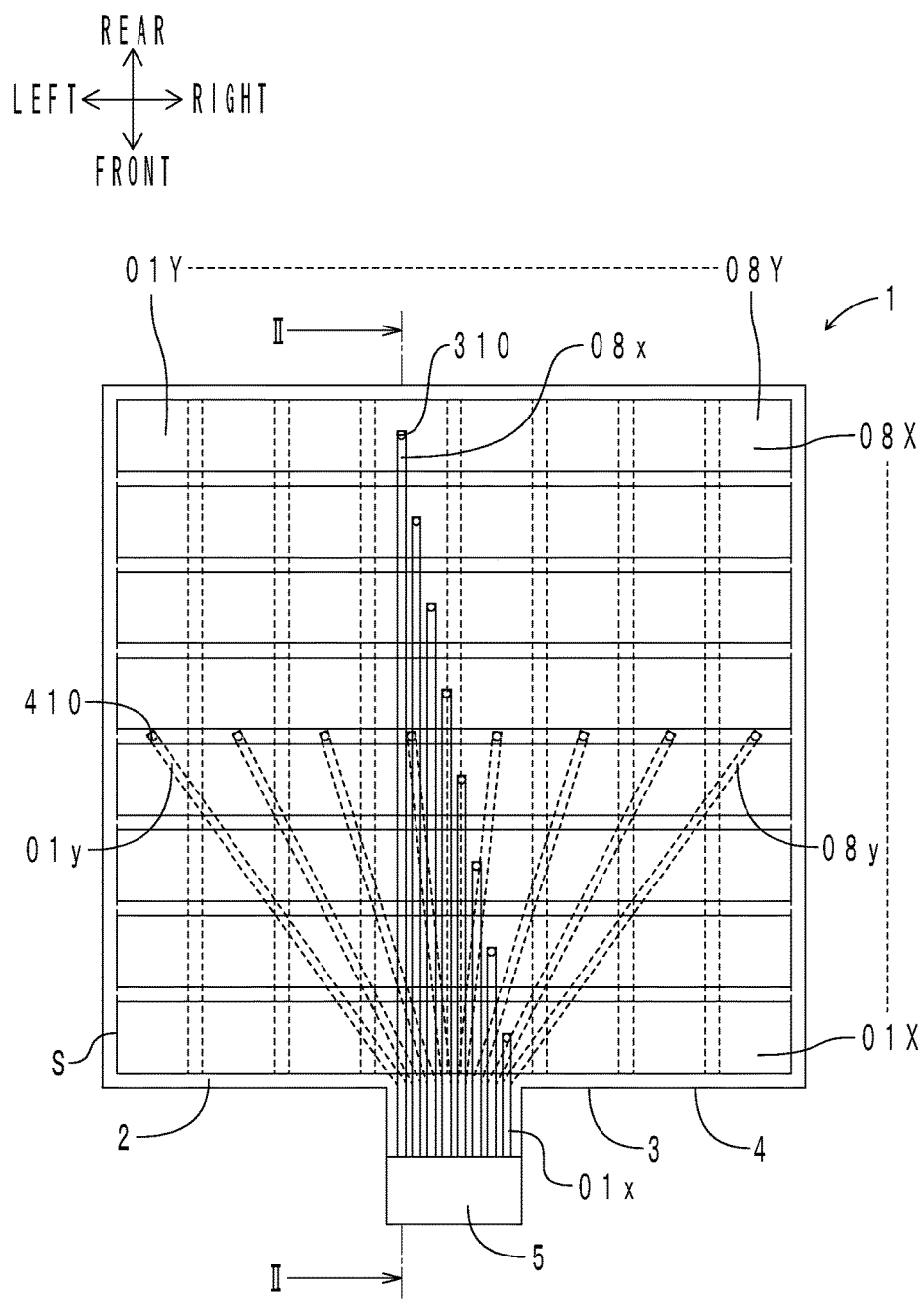
FIG. 1 is a transparent top view of a capacitive sensor of a first embodiment.
Figure 2:
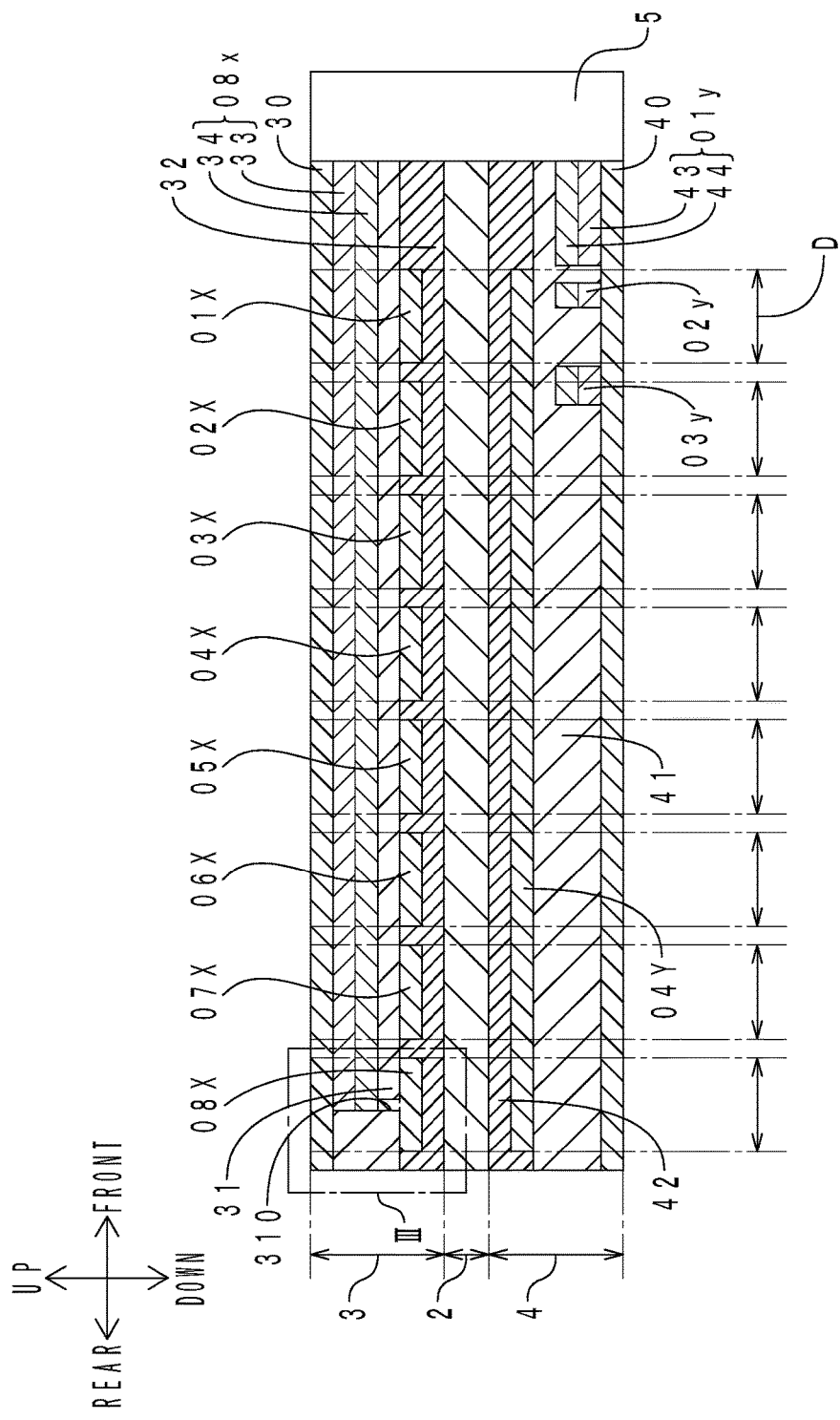
FIG. 2 is a sectional view taken along line II-II in FIG. 1.
Figure 3:
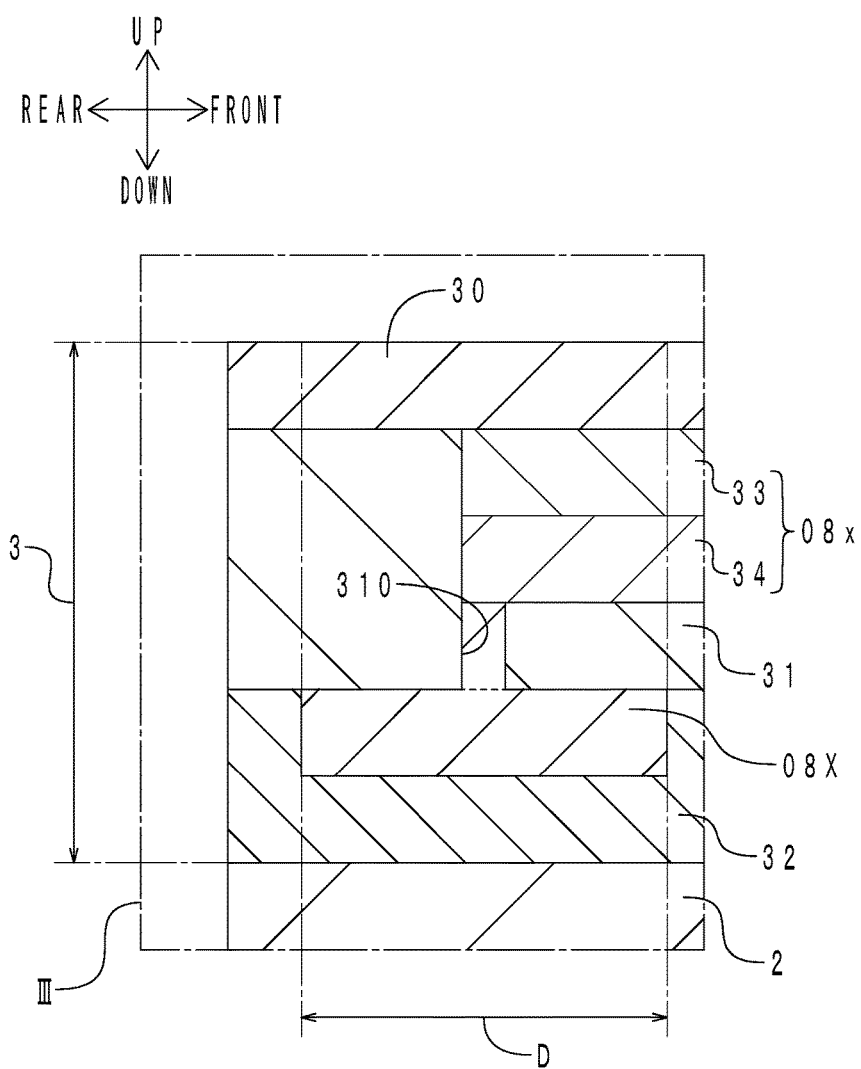
FIG. 3 is an enlarged view of an area III in FIG. 2.

First, the configuration of a capacitive sensor of the present embodiment will be described. FIG. 1 is a transparent top view of the capacitive sensor of the present embodiment. FIG. 2 is a sectional view taken along line II-II in FIG. 1. FIG. 3 is an enlarged view of an area III in FIG. 2. In FIG. 1, a back-side electrode unit is shown by dotted lines.

As shown in FIGS. 1 to 3, a capacitive sensor 1 includes a dielectric layer 2, a front-side electrode unit 3, a back-side electrode unit 4, and a connector 5.

The dielectric layer 2 is made of urethane foam and is in the form of a square sheet. The thickness of the dielectric layer 2 is 300 μm. The front-side electrode unit 3 is located on the upper side of the dielectric layer 2, and the back-side electrode unit 4 is located on the lower side of the dielectric layer 2.

The front-side electrode unit 3 has a front-side substrate 30, eight front-side jumper wiring layers 01x to 08x, a front-side insulating layer 31, eight front-side electrode layers 01X to 08X, and a front-side protective layer 32. The front-side jumper wiring layers 01x to 08x are included in the concept of the "front-side wiring layer" of the present invention.

The front-side substrate 30 is made of polyethylene terephthalate (PET) and is in the form of a substantially square sheet. The thickness of the front-side substrate 30 is 200 μm. The front-side jumper wiring layers 01x to 08x, the front-side insulating layer 31, the front-side electrode layers 01X to 08X, and the front-side protective layer 32 are formed on the lower surface of the front-side substrate 30.

The front-side insulating layer 31 is in the form of a substantially square sheet. The front-side insulating layer 31 has substantially the same size as the front-side substrate 30. The thickness of the front-side insulating layer 31 is 40 μm. The front-side insulating layer 31 contains urethane rubber and titanium oxide particles serving as an anti-blocking agent. The mean particle size of the titanium oxide particles is 0.29 μm. The front-side insulating layer 31 contains 54 parts by mass of the titanium oxide particles per 100 parts by mass of the urethane rubber. The front-side insulating layer 31 has an elongation at break of 139%, a tensile modulus of 23 MPa, a tension set of 0%, a volume resistivity of $6.3 \times 10^{10}$ Ω·cm. The lower surface of the front-side insulating layer 31 has surface roughness (Ra) of 1 μm.

The front-side insulating layer 31 has through holes 310. Eight through holes 310 are disposed so as to correspond to the front-side electrode layers 01X to 08X. The eight through holes 310 are formed in a region around the middle in the left-right direction of the front-side insulating layer 31 so as to be arranged in line in the front-rear direction. The eight through holes 310 extend through the front-side insulating layer 31 in the up-down direction.

The eight front-side jumper wiring layers 01x to 08x are located on the upper surface of the front-side insulating layer 31. The front-side jumper wiring layer 01x extends linearly from a position corresponding to a position around the middle in the left-right direction of the front-side electrode layer 01X to the connector 5. Similarly, each of the front-side jumper wiring layers 02x to 08x also extends linearly from a position corresponding to a position around the middle in the left-right direction of a corresponding one of the front-side electrode layers 02X to 08X to the connector 5. The front-side jumper wiring layers 01x to 08x have a linear shape but are different in length. The front-side jumper wiring layers 01x to 08x are arranged at predetermined intervals in the left-right direction and parallel to each other. The front-side jumper wiring layers 01x to 08x are electrically connected to the front-side electrode layers 01X to 08X via the through holes 310 of the front-side insulating layer 31, respectively.

Each of the front-side jumper wiring layers 01x to 08x has a first wiring layer 33 and a second wiring layer 34 which are stacked in the up-down direction. The first wiring layers 33 are formed on the lower surface of the front-side substrate 30. The first wiring layers 33 contain acrylic rubber and silver powder. The second wiring layers 34 are formed on the lower surfaces of the first wiring layers 33. The second wiring layers 34 contain acrylic rubber and conductive carbon black.

The eight front-side electrode layers 01X to 08X are located on the lower surface of the front-side insulating layer 31. The front-side electrode layers 01X to 08X contain acrylic rubber and conductive carbon black. The front-side electrode layers 01X to 08X have a strip shape and extend in the left-right direction. The front-side electrode layers 01X to 08X are arranged at predetermined intervals in the front-rear direction and parallel to each other. Each of the through holes 310 of the front-side insulating layer 31 is filled with a part of a corresponding one of the front-side electrode layers 01X to 08X.

The front-side protective layer 32 is located on the upper surface of the dielectric layer 2. The front-side protective layer 32 covers the front-side electrode layers 01X to 08X and the front-side insulating layer 31 from below. The front-side protective layer 32 is made of urethane rubber and in the form of a substantially square sheet. The front-side protective layer 32 has substantially the same size as the front-side substrate 30. The thickness of the front-side protective layer 32 is 40 μm.

The back-side electrode unit 4 has the same configuration as the front-side electrode unit 3. That is, the back-side electrode unit 4 has a back-side substrate 40, eight back-side jumper wiring layers 01y to 08y, a back-side insulating layer 41, eight back-side electrode layers 01Y to 08Y, and a back-side protective layer 42. The back-side jumper wiring layers 01y to 08y are included in the concept of the "back-side wiring layer" of the present invention.

The back-side substrate 40 is made of PET and is in the form of a substantially square sheet. The thickness of the back-side substrate 40 is 200 μm. The back-side jumper wiring layers 01y to 08y, the back-side insulating layer 41, the back-side electrode layers 01Y to 08Y, and the back-side protective layer 42 are formed on the upper surface of the back-side substrate 40.

The back-side insulating layer 41 is in the form of a substantially square sheet. The thickness of the back-side insulating layer 41 is 40 μm. The material and physical properties of the back-side insulating layer 41 are the same as those of the front-side insulating layer 31. The upper surface of the back-side insulating layer 41 has surface roughness (Ra) of 1 μm. The back-side insulating layer 41 has through holes 410. Eight through holes 410 are disposed so as to correspond to the back-side electrode layers 01Y to 08Y. The eight through holes 410 are formed in a region around the middle in the front-rear direction of the back-side insulating layer 41 so as to be arranged in line in the left-right direction. The eight through holes 410 extend through the back-side insulating layer 41 in the up-down direction.

The eight back-side jumper wiring layers 01y to 08y are located on the lower surface of the back-side insulating layer 41. The back-side jumper wiring layer 01y extends linearly from a position corresponding to a position around the middle in the front-rear direction of the back-side electrode layer 01y to the connector 5. Similarly, each of the back-side jumper wiring layers 02y to 08y also extends linearly from a position corresponding to a position around the middle in the front-rear direction of a corresponding one of the back-side electrode layers 02Y to 08Y to the connector 5. The back-side jumper wiring layers 01y to 08y have a linear shape and extend inward in a radial pattern from a region around the middle of the front end of the back-side substrate 40. The back-side jumper wiring layers 01y to 08y are electrically connected to the back-side electrode layers 01Y to 08Y via the through holes 410 of the back-side insulating layer 41, respectively.

Each of the back-side jumper wiring layers 01y to 08y has a first wiring layer 43 and a second wiring layer 44 which are stacked in the up-down direction. The first wiring layers 43 are formed on the upper surface of the back-side substrate 40. The first wiring layers 43 contain acrylic rubber and silver powder. The second wiring layers 44 are formed on the upper surfaces of the first wiring layers 43. The second wiring layers 44 contain acrylic rubber and conductive carbon black.

The eight back-side electrode layers 01Y to 08Y are located on the upper surface of the back-side insulating layer 41. The back-side electrode layers 01Y to 08Y contain acrylic rubber and conductive carbon black. The back-side electrode layers 01Y to 08Y have a strip shape and extend in the front-rear direction. The back-side electrode layers 01Y to 08Y are arranged at predetermined intervals in the left-right direction and parallel to each other. Each of the through holes 410 of the back-side insulating layer 41 is filled with a part of a corresponding one of the back-side electrode layers 01Y to 08Y.

The back-side protective layer 42 is located on the lower surface of the dielectric layer 2. The back-side protective layer 42 covers the back-side electrode layers 01Y to 08Y and the back-side insulating layer 41 from above. The back-side protective layer 42 is made of urethane rubber and in the form of a substantially square sheet. The thickness of the back-side protective layer 42 is 40 μm.

The front-side electrode layers 01X to 08X and the back-side electrode layer 01Y to 08Y are arranged in a grid pattern as viewed from above. A plurality of detection units D are disposed in the portions where the front-side electrode layers 01X to 08X overlap the back-side electrode layers 01Y to 08Y. The total number of detection units D is 64. A region where the detection units D are disposed (a region where the front-side electrodes layers 01X to 08X and the back-side electrode layers 01Y to 08Y are disposed) serves as a pressure sensitive region S where a load can be detected.

The connector 5 is disposed in the middle of the front part of the capacitive sensor 1. The front-side jumper wiring layers 01x to 08x and the back-side jumper wiring layers 01y to 08y are insulated from each other and electrically connected to the connector 5. The connector 5 is electrically connected to a control device, not shown.

<Method for Manufacturing Capacitive Sensor>

A method for manufacturing the capacitive sensor of the present embodiment will be described below. The method for manufacturing the capacitive sensor of the present embodiment includes an electrode unit producing step and a placing step.

[Electrode Unit Producing Step]

Figure 4:
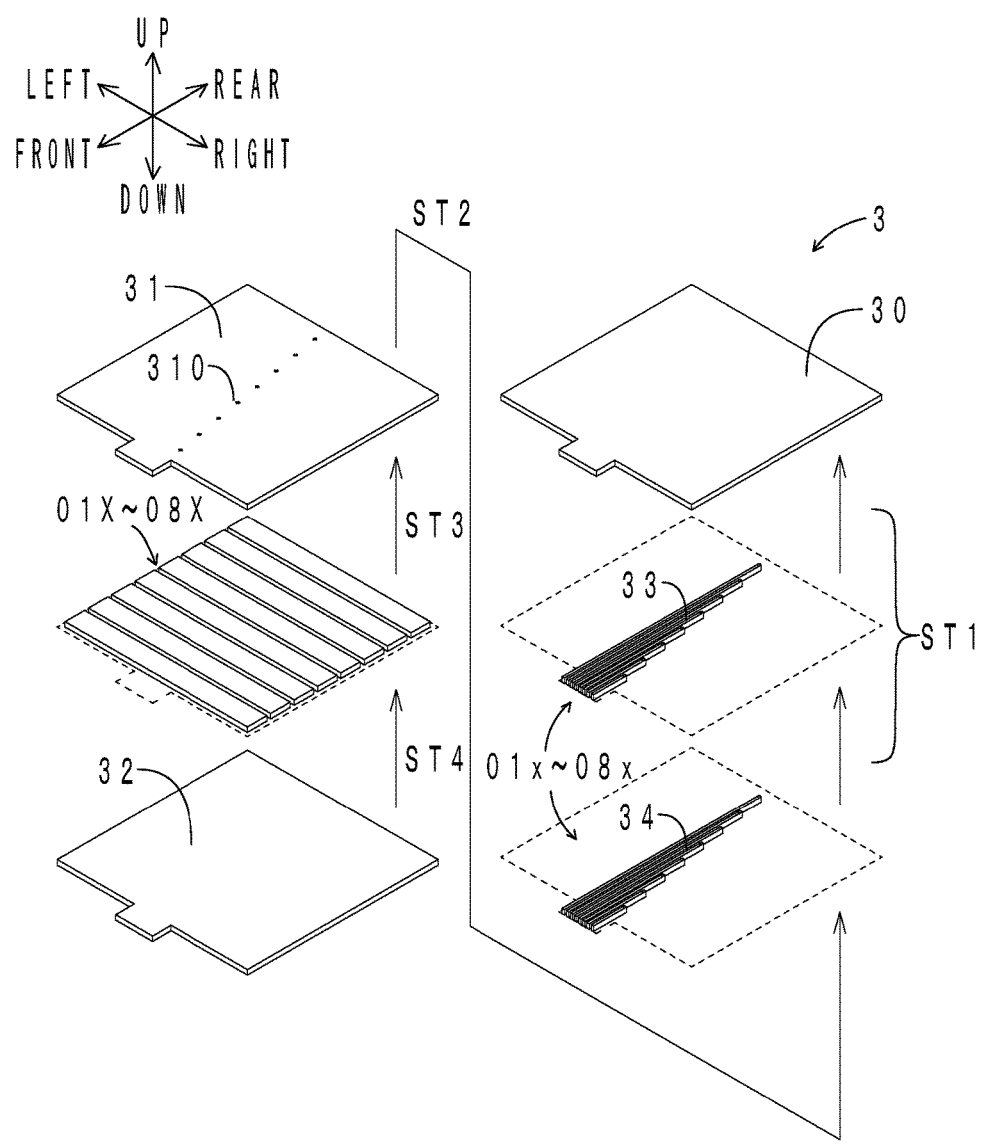
FIG. 4 is an exploded perspective view of a front-side electrode unit in the capacitive sensor of the first embodiment.

The electrode unit producing step includes a front-side electrode unit producing step of producing the front-side electrode unit 3, and a back-side electrode unit producing step of producing the back-side electrode unit 4. First, the front-side electrode unit producing step will be described. FIG. 4 is an exploded perspective view of the front-side electrode unit 3. As shown in FIG. 4, the front-side electrode unit producing step includes four printing steps (1) to (4).

(1) First Printing Step (ST1 in FIG. 4)

In the first printing step, the front-side jumper wiring layers 01x to 08x are formed on the lower surface of the front-side substrate 30 by screen printing. First, a first wiring coating material for forming the first wiring layers 33 and a second wiring coating material for forming the second wiring layers 34 are prepared. Next, the first wiring coating material thus prepared is printed on the lower surface of the front-side substrate 30 (the lower surface in FIG. 4; the front-side substrate 30 is placed with its lower surface facing upward during printing. The same applies to the front-side electrode unit producing step.) with a screen printing machine. Coating films thus formed are cured by heating to form the eight first wiring layers 33. Then, the second wiring coating material prepared is printed on the lower surfaces of the first wiring layers 33 with the screen printing machine. Coating films thus formed are cured by heating to form the eight second wiring layers 34. The front-side jumper wiring layers 01x to 08x, each consists of a stack of the first wiring layer 33 and the second wiring layer 34, are thus formed on the lower surface of the front-side substrate 30.

(2) Second Printing Step (ST2 in FIG. 4)

In the second printing step, the front-side insulating layer 31 is formed by screen printing so as to cover the front-side jumper wiring layers 01x to 08x. First, an insulating layer coating material for forming the front-side insulating layer 31 is prepared. Next, the insulating layer coating material thus prepared is printed on the lower surface of the front-side substrate 30 with the screen printing machine so as to cover the front-side jumper wiring layers 01x to 08x. A coating film thus formed is cured by heating to form the front-side insulating layer 31.

(3) Third Printing Step (ST3 in FIG. 4)

In the third printing step, the front-side electrode layers 01X to 08X are formed by screen printing so as to cover the through holes 310 of the front-side insulating layer 31. First, an electrode coating material for forming the front-side electrode layers 01X to 08X is prepared. Next, the electrode coating material thus prepared is printed on the lower surface of the front-side insulating layer 31 with the screen printing machine. Coating films thus formed are cured by heating to form the eight front-side electrode layers 01X to 08X.

(4) Fourth Printing Step (ST4 in FIG. 4)

In the fourth printing step, the front-side protective layer 32 is formed by screen printing so as to cover the front-side electrode layers 01X to 08X. First, a protective layer coating material for forming the front-side protective layer 32 is prepared. Next, the protective layer coating material thus prepared is printed with the screen printing machine so as to cover the front-side electrode layers 01X to 08X. A coating film thus formed is cured by heating to form the front-side protective layer 32.

Figure 5:
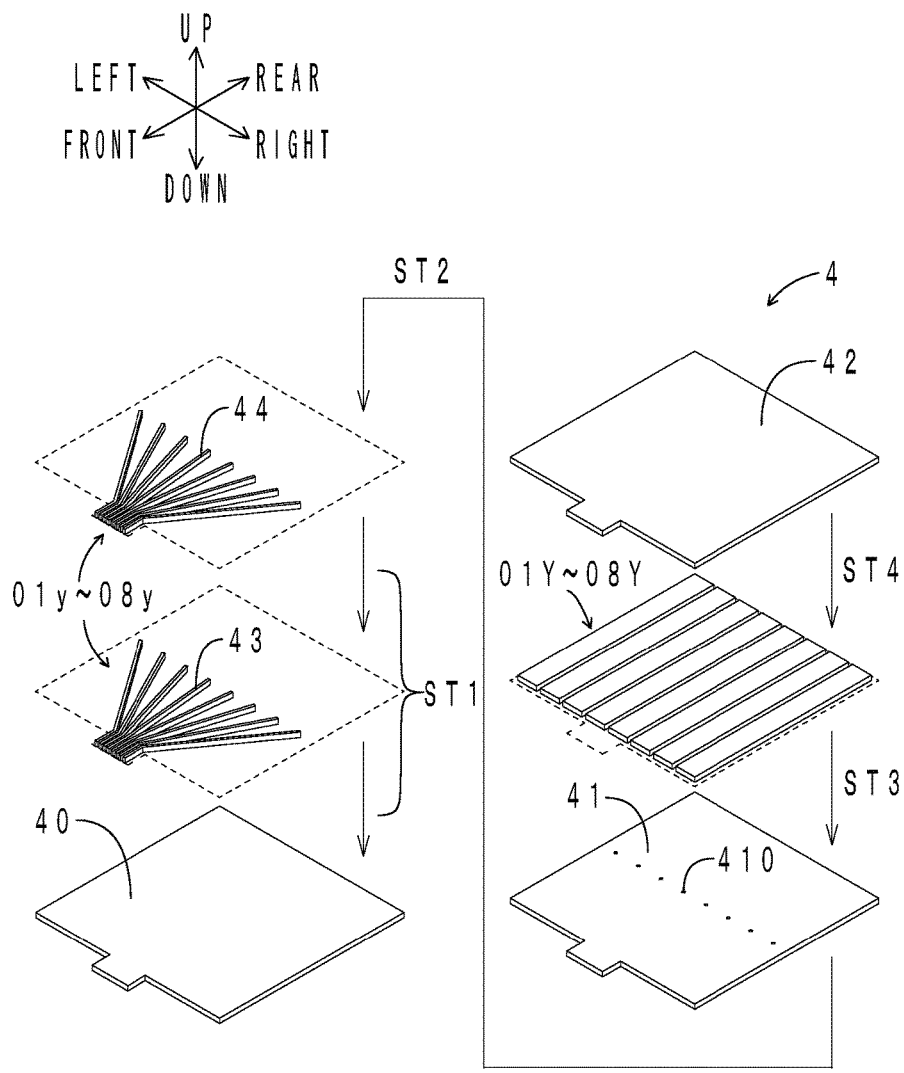
FIG. 5 is an exploded perspective view of a back-side electrode unit in the capacitive sensor of the first embodiment.

The back-side electrode unit producing step will be described. FIG. 5 is an exploded perspective view of the back-side electrode unit. As shown in FIG. 5, the back-side electrode unit producing step includes four printing steps (1) to (4).

(1) First Printing Step (ST1 in FIG. 5)

In the first printing step, the back-side jumper wiring layers 01y to 08y are formed on the upper surface of the back-side substrate 40 by screen printing. First, a first wiring coating material for forming the first wiring layers 43 and a second wiring coating material for forming the second wiring layers 44 are prepared. Next, the first wiring coating material thus prepared is printed on the lower surface of the back-side substrate 40 with the screen printing machine. Coating films thus formed are cured by heating to form the eight first wiring layers 43. Then, the second wiring coating material prepared is printed on the upper surfaces of the first wiring layers 43 with the screen printing machine. Coating films thus formed are cured by heating to form the eight second wiring layers 44. The back-side jumper wiring layers 01y to 08y, each consists of a stack of the first wiring layer 43 and the second wiring layer 44, are thus formed on the upper surface of the back-side substrate 40.

(2) Second Printing Step (ST2 in FIG. 5)

In the second printing step, the back-side insulating layer 41 is formed by screen printing so as to cover the back-side jumper wiring layers 01y to 08y. First, an insulating layer coating material for forming the back-side insulating layer 41 is prepared. Next, the insulating layer coating material thus prepared is printed on the upper surface of the back-side substrate 40 with the screen printing machine so as to cover the back-side jumper wiring layers 01y to 08y. A coating film thus formed is cured by heating to form the back-side insulating layer 41.

(3) Third Printing Step (ST3 in FIG. 5)

In the third printing step, the back-side electrode layers 01Y to 08Y are formed by screen printing so as to cover the through holes 410 of the back-side insulating layer 41. First, an electrode coating material for forming the back-side electrode layers 01Y to 08Y is prepared. Next, the electrode coating material thus prepared is printed on the upper surface of the back-side insulating layer 41 with the screen printing machine. Coating films thus formed are cured by heating to form the eight back-side electrode layers 01Y to 08Y.

(4) Fourth Printing Step (ST4 in FIG. 5)

In the fourth printing step, the back-side protective layer 42 is formed by screen printing so as to cover the back-side electrode layers 01Y to 08Y. First, a protective layer coating material for forming the back-side protective layer 42 is prepared. Next, the protective layer coating material thus prepared is printed with the screen printing machine so as to cover the back-side electrode layers 01Y to 08Y. A coating film thus formed is cured by heating to form the back-side protective layer 42.

[Placing Step]

In the placing step, the front-side electrode unit 3 prepared is placed on the upper surface of the dielectric layer 2 such that the front-side substrate 30 faces upward, and the back-side electrode unit 4 prepared is placed on the lower surface of the dielectric layer 2 such that the back-side substrate 40 faces downward. A projecting portion in the middle of the front part of the front-side electrode unit 3 and a projecting portion in the middle of the front part of the back-side electrode unit 4 are connected to the connector 5. The capacitive sensor 1 is thus manufactured.

<Operation of Capacitive Sensor>

Operation of the capacitive sensor 1 of the present embodiment will be described below. First, before a load is applied to the capacitive sensor 1 (initial state), a voltage is applied to the front-side electrode layers 01X to 08X and the back-side electrode layers 01Y to 08Y to calculate capacitance C for each detection unit D. Similarly, after a load is applied to the capacitive sensor 1, capacitance C is calculated for each detection unit D. The distance between the front-side electrode layer and the back-side electrode layer is reduced in those detection units D which are located in a region that is subjected to the load. Accordingly, the capacitance C in those detection units D is increased. The surface pressure in each detection unit D is calculated based on the amount of change ΔC in capacitance C. Load distribution in the pressure sensitive region S can be measured in this manner.

<Functions and Effects of Capacitive Sensor and Method for Manufacturing the Same>

Functions and effects of the capacitive sensor 1 and the method for manufacturing the same according to the present embodiment will be described. The front-side electrode unit 3 and the back-side electrode unit 4 have the same configuration. Accordingly, those functions and effects which are common to the front-side electrode unit 3 and the back-side electrode unit 4 will be described only for the front-side electrode unit 3.

The front-side electrode unit 3 has a three-dimensional wiring structure in which the front-side electrode layers 01X to 08X and the front-side jumper wiring layers 01x to 08x are arranged three-dimensionally with the front-side insulating layer 31 interposed therebetween. Similarly, the back-side electrode unit 4 has a three-dimensional wiring structure in which the back-side electrode layers 01Y to 08Y and the back-side jumper wiring layers 01y to 08y are arranged three-dimensionally with the back-side insulating layer 41 interposed therebetween. The front-side jumper wiring layers 01x to 08x can be placed on the upper side of the front-side electrode layers 01X to 08X so as to overlap the front-side electrode layers 01X to 08X. The front-side jumper wiring layers 01x to 08x therefore need not be placed on the same plane as the front-side electrode layers 01X to 08X so as to avoid the front-side electrode layers 01X to 08X. This configuration can reduce the size of a dead region (region other than the pressure sensitive region S) where only the front-side jumper wiring layers 01x to 08x are placed) and can therefore make it easy to reduce the size and weight of the capacitive sensor 1. Moreover, the front-side jumper wiring layers 01x to 08x can be connected to desired parts of the front-side electrode layers 01X to 08X. This configuration therefore improves flexibility in designing arrangement of the front-side jumper wiring layers 01x to 08x and flexibility in designing the sensor shape.

The front-side insulating layer 31 of the front-side electrode unit 3 has an elongation at break of 60% or more and a tension set of less than 5%. Similarly, the back-side insulating layer 41 of the back-side electrode unit 4 has an elongation at break of 60% or more and a tension set of less than 5%. The front-side insulating layer 31 extends and contracts according to elastic deformation of the front-side electrode layers 01X to 08X, and is less likely to delaminate or fracture even after repeated extension and contraction. The capacitive sensor 1 is therefore flexible and highly durable.

The front-side insulating layer 31 and the back-side insulating layer 41 has a tensile modulus of greater than 10 MPa. The front-side insulating layer 31 and the back-side insulating layer 41 contain an elastomer and an anti-blocking agent. In this case, the insulating layer coating material for forming the front-side insulating layer 31 and the insulating layer coating material for forming the back-side insulating layer 41 are not so tacky. Accordingly, even when the front-side insulating layer 31 and the back-side insulating layer 41 are formed by screen printing, the coating films are less likely to stick to the printing plate when printed. This configuration thus achieves improved printing accuracy, a higher yield, and improved work performance. The content of the anti-blocking agent is 18 parts by mass or more and less than 107 parts by mass per 100 parts by mass of the elastomer. With the use of the front-side insulating layer 31 and the back-side insulating layer 41, sticking of the coating film to the printing plate can be restrained, and extensibility and adhesion of the insulating layer to a mating member can be achieved.

The front-side electrode layers 01X to 08X and the front-side jumper wiring layers 01x to 08x contain an elastomer as a base material. Similarly, the back-side electrode layers 01Y to 08Y and the back-side jumper wiring layers 01y to 08y contain an elastomer as a base material. The front-side electrode layers 01X to 08X and the front-side jumper wiring layers 01x to 08x are therefore flexible and highly extendable and contractible. The entire front-side electrode unit 3 including the front-side insulating layer 31 therefore tends to elastically deform in accordance with elastic deformation of the dielectric layer 2. The capacitive sensor 1 thus has improved overall flexibility and durability.

The strip-shaped front-side electrode layers 01X to 08X of the front-side electrode unit 3 are disposed over the entire surface of the dielectric layer 2. Similarly, the strip-shaped back-side electrode layers 01Y to 08Y of the back-side electrode unit 4 are disposed over the entire surface of the dielectric layer 2. The detection units D are disposed in the portions where the front-side electrode layers 01X to 08X overlap the back-side electrode layers 01Y to 08Y. The detection units D can thus be dispersed over the entire surface of the dielectric layer 2, whereby load distribution in a large region can be measured.

The front-side electrode unit 3 has the front-side substrate 30, and the front-side jumper wiring layers 01x to 08x, the front-side insulating layer 31, the front-side electrode layers 01X to 08X, and the front-side protective layer 32 are formed on the lower surface of the front-side substrate 30. Similarly, the back-side electrode unit 4 has the back-side substrate 40, and the back-side jumper wiring layers 01y to 08y, the back-side insulating layer 41, the back-side electrode layers 01Y to 08Y, and the back-side protective layer 42 are formed on the upper surface of the back-side substrate 40. The capacitive sensor 1 can thus be easily manufactured by merely sandwiching the dielectric layer 2 between the front-side substrate 30 and the back-side substrate 40 such that the front-side substrate 30 and the back-side substrate 40 face outward.

According to the method for manufacturing the capacitive sensor 1 of the present embodiment, the front-side jumper wiring layers 01x to 08x, the front-side insulating layer 31, the front-side electrode layers 01X to 08X, and the front-side protective layer 32 can be easily formed on the lower surface of the front-side substrate 30 by screen printing with high dimensional accuracy. Similarly, the back-side jumper wiring layers 01y to 08y, the back-side insulating layer 41, and the back-side electrode layers 01Y to 08Y, and the back-side protective layer 42 can be easily formed on the upper surface of the back-side substrate 40 by screen printing with high dimensional accuracy. With screen printing, the front-side jumper wiring layers 01x to 08x, the back-side jumper wiring layers 01y to 08y, etc. can be easily formed in various shapes. Moreover, since a relatively viscous coating material can be used in screen printing, it is easy to adjust the thickness of a coating film and to form a layer with a relatively high tensile modulus.

Second Embodiment

The configuration of a sensor sheet of the present embodiment is different from that of the capacitive sensor of the first embodiment in the number of front-side electrode layers and back-side electrode layers, the number of detection units, the number of front-side jumper wiring layers and back-side jumper wiring layers, and the wiring patterns of the front-side jumper wiring layers and the back-side jumper wiring layers, etc. A method for manufacturing the sensor sheet of the present embodiment is similar to the method for manufacturing the capacitive sensor of the first embodiment. A method for manufacturing a capacitive sensor of the present embodiment is different from the method for manufacturing the capacitive sensor of the first embodiment in that the method for manufacturing the capacitive sensor of the present embodiment has a cutting step. The differences in configuration from the first embodiment will be mainly described below.

<Configuration of Sensor Sheet>

Figure 6:
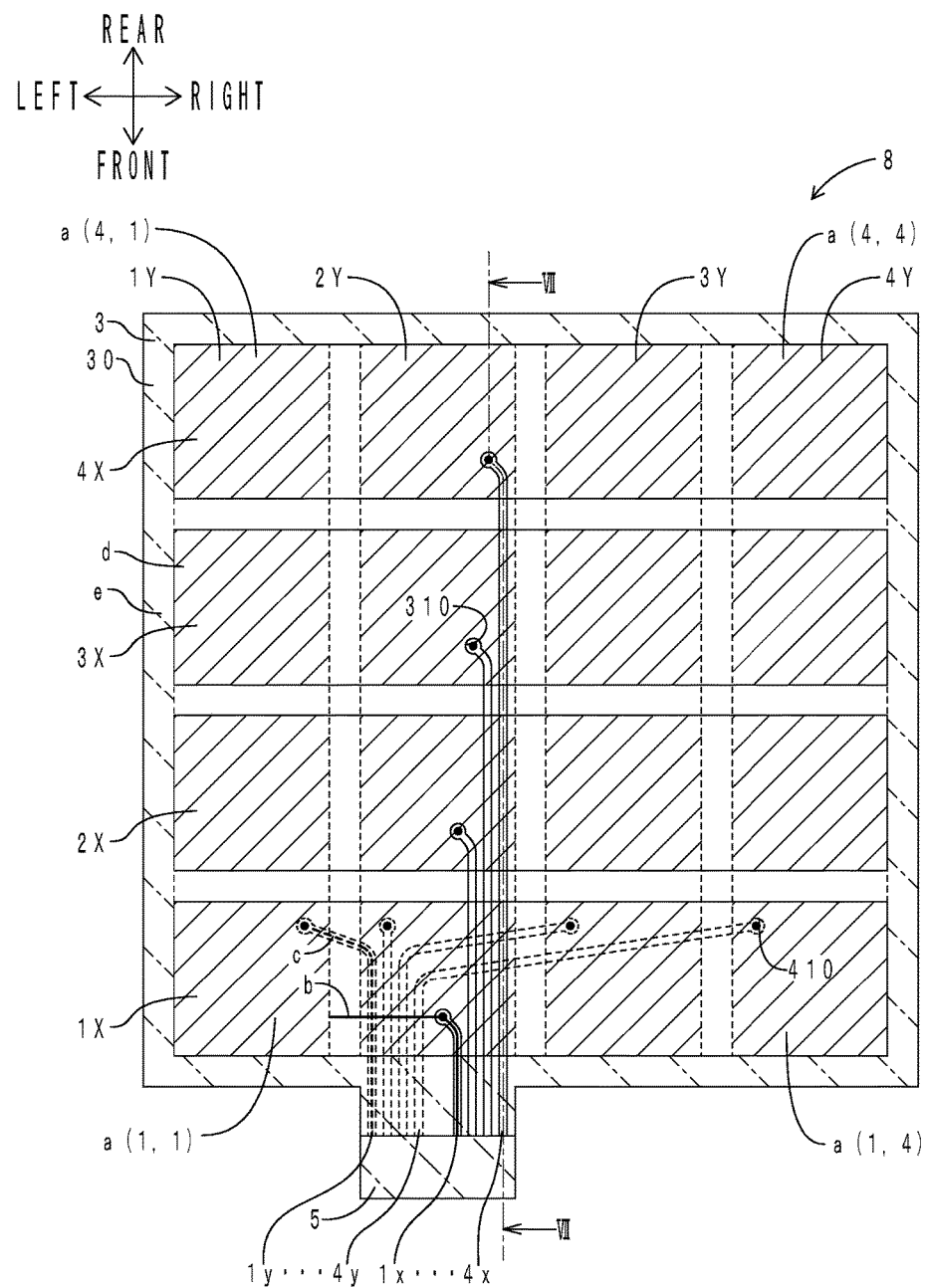
FIG. 6 is a transparent top view of a sensor sheet of a second embodiment.
Figure 7:
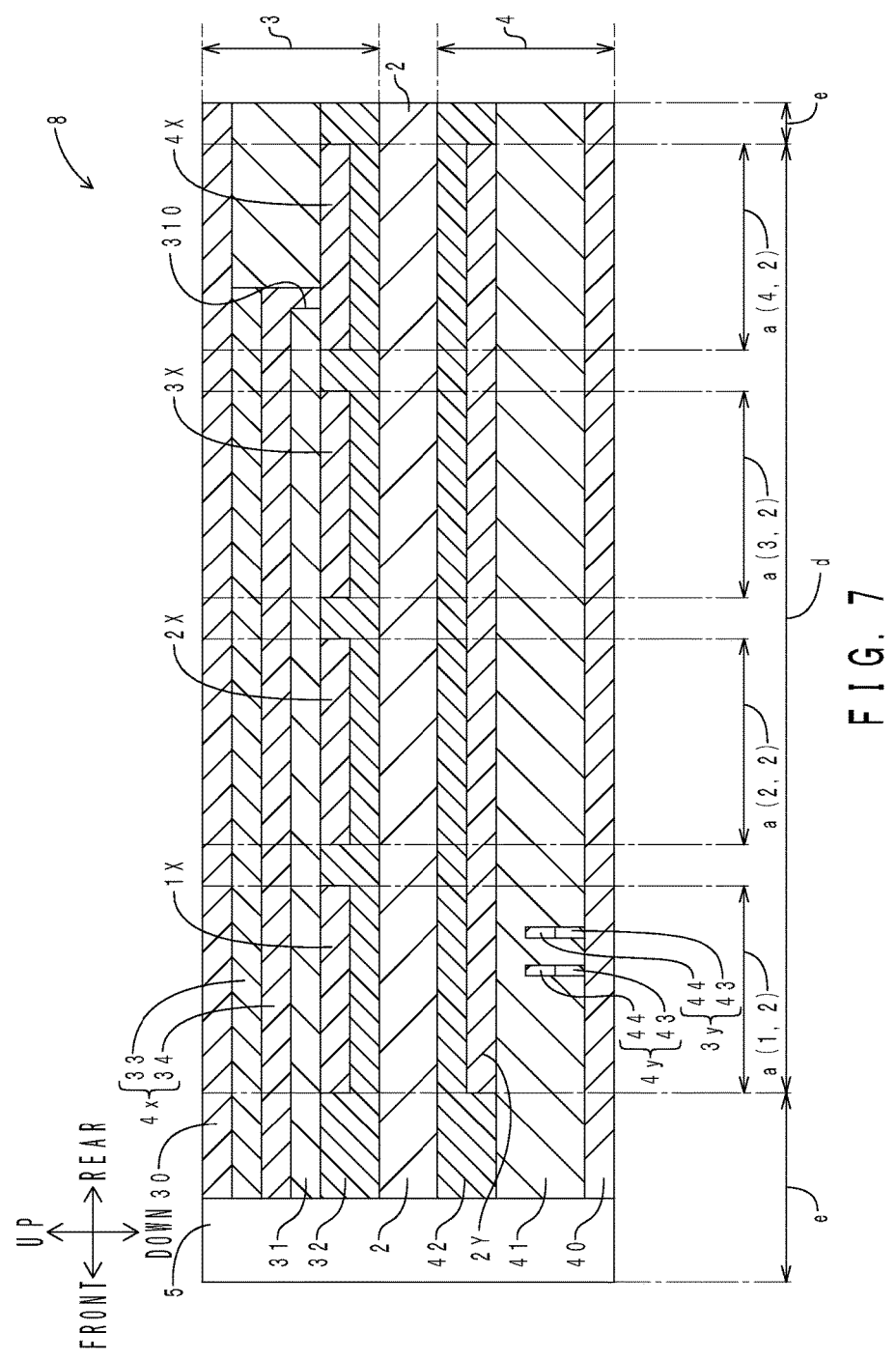
Figure 8:
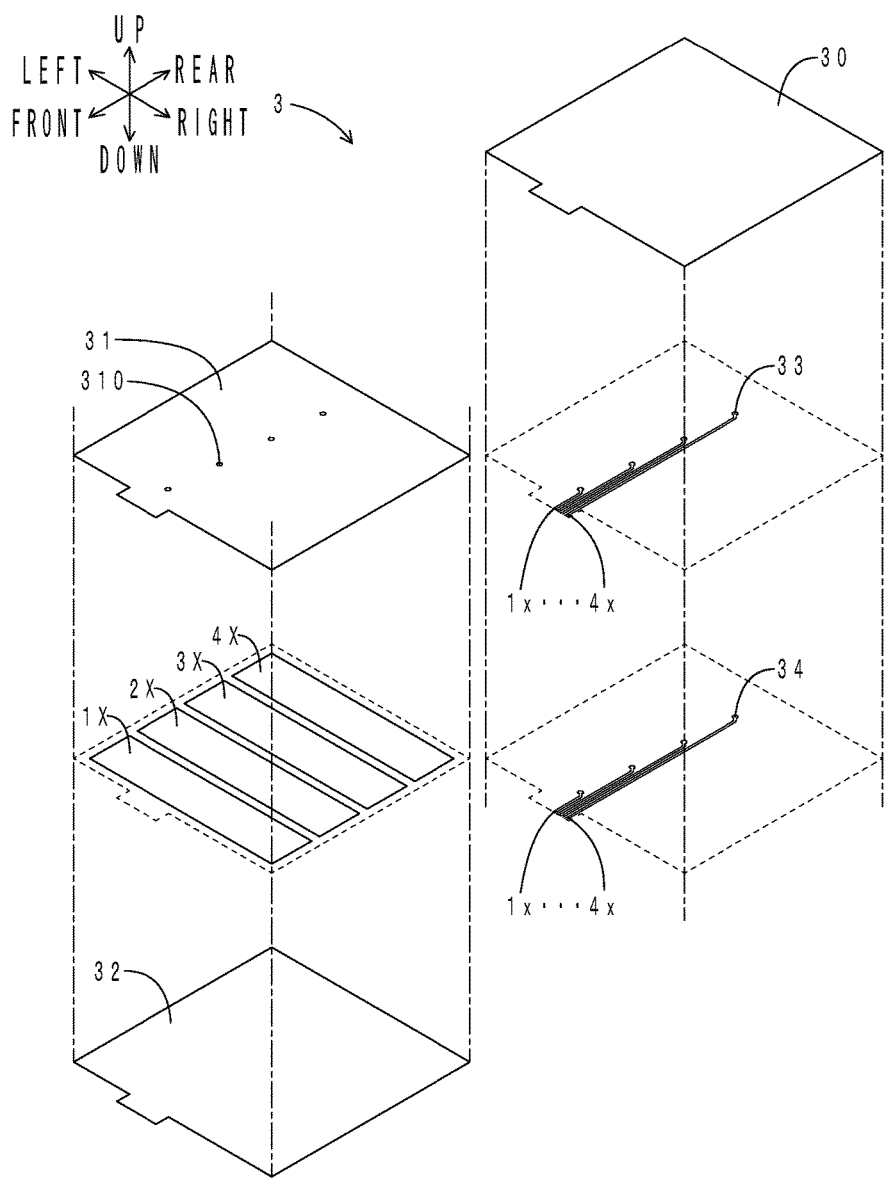
FIG. 8 is an exploded perspective view of a front-side electrode unit of the sensor sheet.
Figure 9:
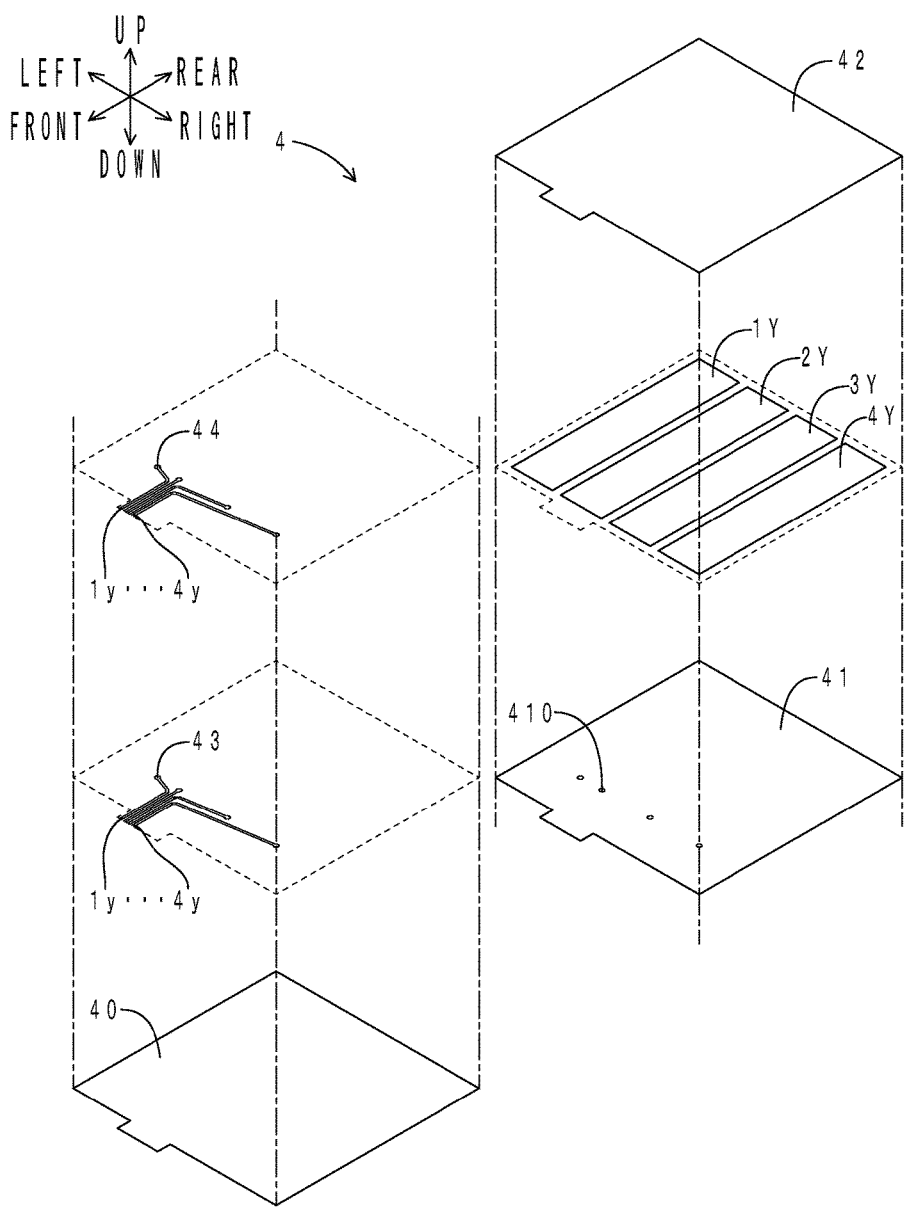
FIG. 9 is an exploded perspective view of a back-side electrode unit of the sensor sheet.

First, the configuration of the sensor sheet of the present embodiment will be described. FIG. 6 is a transparent top view of the sensor sheet of the present embodiment. FIG. 7 is a sectional view taken along line VII-VII in FIG. 6. FIG. 8 is an exploded perspective view of a front-side electrode unit of the sensor sheet. FIG. 9 is an exploded perspective view of a back-side electrode unit of the sensor sheet. In FIG. 6, the back-side electrode unit is shown by dotted lines. In FIGS. 6 to 9, portions corresponding to those in FIGS. 1 to 5 are denoted with the same reference characters as those in FIGS. 1 to 5.

As shown in FIGS. 6 to 9, a sensor sheet 8 includes a dielectric layer 2, a front-side electrode 3, a back-side electrode unit 4, and a connector 5. The connector 5 is included in the concept of the "extended portion" of the present invention.

[Front-Side Electrode Unit 3]

As shown in FIG. 8, the front-side electrode unit 3 includes four front-side jumper wiring layers 1x to 4x and four front-side electrode layers 1X to 4X. The front-side jumper wiring layers 1x to 4x are included in the concept of the "front-side wiring layer" of the present invention. A front-side insulating layer 31 has four through holes 310. The through holes 310 are included in the concept of the "front-side through hole" of the present invention. The four through holes 310 face the four front-side electrode layers 1X to 4X in the up-down direction. As shown in FIG. 6, the four through holes 310 are arranged in the front-rear direction so as to be located on the second back-side electrode layer 2Y from the left (the back-side electrode layer closest to the connector 5) as viewed from above.

As shown in FIG. 8, the four front-side jumper wiring layers 1x to 4x are located on the upper surface of the front-side insulating layer 31. The four front-side electrode layers 1X to 4X are located on the lower surface of the front-side insulating layer 31. The front-side electrode layers 1X to 4X have a strip shape extending in the left-right direction. The front-side electrode layers 1X to 4X are arranged at predetermined intervals in the front-rear direction and parallel to each other.

The front-side jumper wiring layers 1x to 4x are electrically connected to the front-side electrode layers 1X to 4X via the through holes 310. Specifically, the front-side jumper wiring layer 1x is electrically connected to the front-side electrode layer 1X, the front-side jumper wiring layer 2x is electrically connected to the front-side electrode layer 2X, the front-side jumper wiring layer 3x is electrically connected to the front-side electrode layer 3X, and the front-side jumper wiring layer 4x is electrically connected to the front-side electrode layer 4X. As shown by black dots in FIG. 6, front-side contacts (contacts between the front-side jumper wiring layers 1x to 4x and the front-side electrode layers 1x to 4X) are located radially inside the through holes 310 as viewed from above.

[Back-Side Electrode Unit 4]

The back-side electrode unit 4 has the same configuration as the front-side electrode unit 3. As shown in FIG. 9, the back-side electrode unit 4 includes four back-side jumper wiring layers 1y to 4y and four back-side electrode layers 1Y to 4Y. The back-side jumper wiring layers 1y to 4y are included in the concept of the "back-side wiring layer" of the present invention. The back-side insulating layer 41 has four through holes 410. The through holes 410 are included in the concept of the "back-side through hole" of the present invention. The four through holes 410 face the four back-side electrode layers 1Y to 4Y in the up-down direction. As shown in FIG. 6, the four through holes 410 are arranged in the left-right direction so as to be located on the first front-side electrode layer 1X from the front (the front-side electrode layer closest to the connector 5) as viewed from above.

As shown in FIG. 9, the back-side electrode layers 1Y to 4Y have a strip shape extending in the front-rear direction. The back-side electrode layers 1Y to 4Y are arranged at predetermined intervals in the left-right direction and parallel to each other.

The back-side jumper wiring layers 1y to 4y are electrically connected to the back-side electrode layers 1Y to 4Y via the through holes 410. Specifically, the back-side jumper wiring layer 1y is electrically connected to the back-side electrode layer 1Y, the back-side jumper wiring layer 2y is electrically connected to the back-side electrode layer 2Y, the back-side jumper wiring layer 3y is electrically connected to the back-side electrode layer 3Y, and the back-side jumper wiring layer 4y is electrically connected to the back-side electrode layer 4Y. As shown by black dots in FIG. 6, back-side contacts (contacts between the back-side jumper wiring layers 1y to 4y and the back-side electrode layers 1Y to 4Y) are located radially inside the through holes 410 as viewed form above.

[Connector 5]

As shown in FIG. 6, the connector 5 is disposed on the front side of the sensor sheet 8. The front-side jumper wiring layers 1x to 4x and the back-side jumper wiring layers 1y to 4y are insulated from each other and electrically connected to the connector 5.

<Detection Units, Front Detection Path, and Back-Side Detection Path>

As shown in FIG. 6, the front-side electrode layers 1X to 4X and the back-side electrode layers 1Y to 4Y are arranged in a grid pattern as viewed from above. A total of 16 detection units a(1, 1) to a(4, 4) are disposed in the portions where the front-side electrode layers 1X to 4X overlap the back-side electrode layers 1Y to 4Y. The detection units are herein referred to as the detection units a(○, △). In a(○, △), "○" corresponds to the front-side electrode layers 1X to 4X, and "△" corresponds to the back-side electrode layers 1Y to 4Y.

A front-side detection path is formed between a desired one of the detection units a(1, 1) to a(4, 4) and the connector 5. The front-side detection path runs through at least a corresponding one of the front-side jumper wiring layers 1x to 4x. For example, as shown by a thick solid line in FIG. 6, a front-side detection path b running through at least a part of the front-side electrode layer 1X and the front-side jumper wiring layer 1x is formed between the detection unit a(1, 1) and the connector 5.

Similarly, a back-side detection path is formed between a desired one of the detection units a(1, 1) to a(4, 4) and the connector 5. The back-side detection path runs through at least a corresponding one of the back-side jumper wiring layers 1y to 4y. For example, as shown by a thick dotted line in FIG. 6, a back-side detection path c running through only the back-side jumper wiring layer 1y is formed between the detection unit a(1, 1) and the connector 5.

[Pressure Sensitive Region and Dead Region]

An area where the front-side electrode layers 1X to 4X and the back-side electrode layers 1Y to 4Y are disposed (an area where the detection units a(1, 1) to a(4, 4) are disposed) is a pressure sensitive region d where a load can be detected. An area where the front-side electrode layers 1X to 4X and the back-side electrode layers 1Y to 4Y are not disposed (an area where the connector 5, parts of the front-side jumper wiring layers 1x to 4x, and parts of the back-side jumper wiring layers 1y to 4y are disposed), which is an area hatched with alternate long and short dash lines in FIG. 6, is a dead region e where a load cannot be detected. The dead region e is in the shape of a frame and surrounds the pressure sensitive region d from the outside in the planar direction (direction perpendicular to the up-down direction).

<Configuration of Capacitive Sensor>

Next, the configuration of the capacitive sensor of the present embodiment will be described. FIGS. 10A to 10D are transparent top views each showing a capacitive sensor including a sensor body cut from the sensor sheet shown in FIG. 6. The front-side jumper wiring layers 1x to 4x and the front-side electrode layers 1X to 4X are shown by solid lines, the back-side jumper wiring layers 1y to 4y and the back-side electrode layers 1Y to 4Y are shown by dotted lines, and the front-side contacts and the back-side contacts are shown by black dots.

Figure 10A:
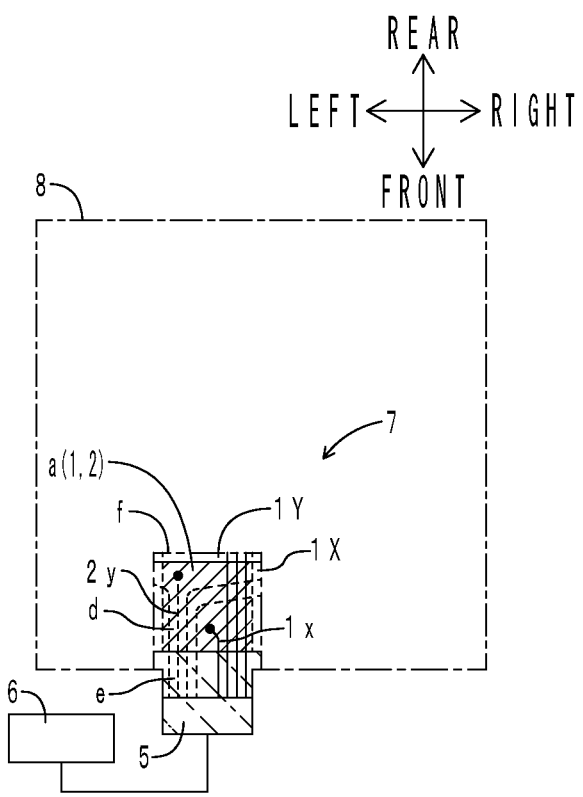
FIGS. 10A to 10D are transparent top views each showing a capacitive sensor including a sensor body cut from the sensor sheet shown in FIG. 6.

As shown in FIG. 10A, a capacitive sensor 7 includes a small quadrilateral sensor body f cut from the sensor sheet 8 and a control unit 6. The sensor body f includes the detection unit a(1, 2), the connector 5, and a front-side detection path and a back-side detection path for the detection unit a(1, 2). The control unit 6 is electrically connected to the connector 5. The control unit 6 measures load distribution in the pressure sensitive region d.

The front-side detection path for the detection unit a(1, 2) runs through only the front-side jumper wiring layer 1x. The back-side detection path for the detection unit a(1, 2) runs through only the back-side jumper wiring layer 2y.

Figure 10B:
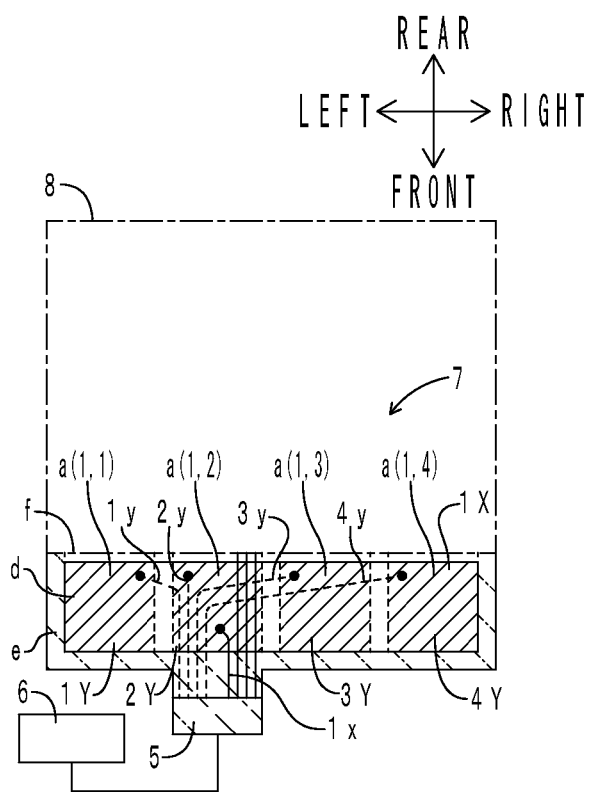

As shown in FIG. 10B, a capacitive sensor 7 includes a strip-shaped sensor body f cut from the sensor sheet 8 and the control unit 6. The sensor body f includes the detection units a(1, 1) to a(1, 4), the connector 5, and front-side detection paths and back-side detection paths for the detection units a(1, 1) to a(1, 4).

The front-side detection path for the detection unit a(1, 1) runs through a part of the front-side electrode layer 1x and the front-side jumper wiring layer 1x. The back-side detection path for the detection unit a(1, 1) runs through only the back-side jumper wiring layer 1y. The front-side detection path and the back-side detection path for the detection unit a(1, 2) are similar to those in FIG. 10A. The front-side detection path for the detection unit a(1, 3) runs through a part of the front-side electrode layer 2X and the front-side jumper wiring layer 1x. The back-side detection path for the detection unit a(1, 3) runs through only the back-side jumper wiring layer 3y. The front-side detection path for the detection unit a(1, 4) runs through a part of the front-side electrode layer 1X and the front-side jumper wiring layer 1x. The back-side detection path for the detection unit a(1, 4) runs through only the back-side jumper wiring layer 4y.

Figure 10C:
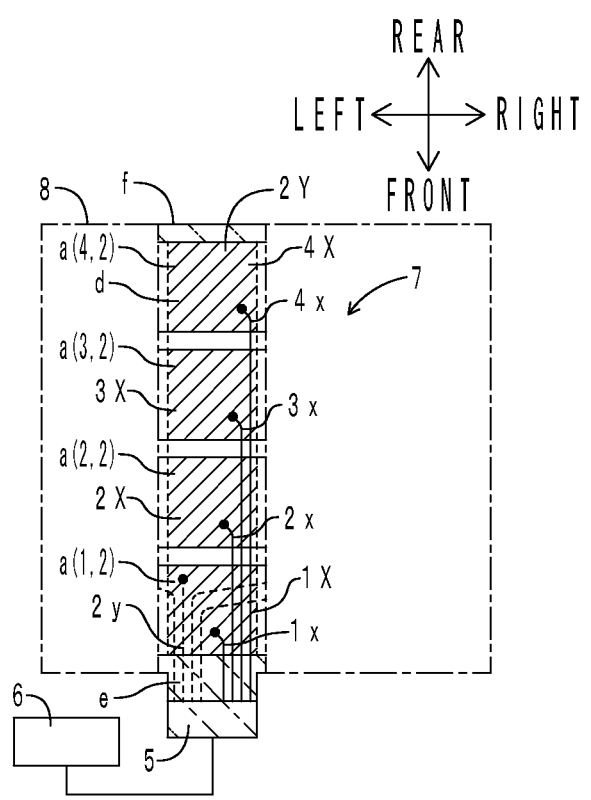

As shown in FIG. 10C, a capacitive sensor 7 includes a strip-shaped sensor body f cut from the sensor sheet 8 and the control unit 6. The sensor body f includes the detection units a(1, 2) to a(4, 2), the connector 5, and front-side detection paths and back-side detection paths for the detection units a(1, 2) to a(4, 2). The front-side detection path and the back-side detection path for the detection unit a(1, 2) are similar to those in FIG. 10A. The front-side detection path for the detection unit a(2, 2) runs through only the front-side jumper wiring layer 2x. The back-side detection path for the detection unit a(2, 2) runs through a part of the back-side electrode layer 2Y and the back-side jumper wiring layer 2y. The front-side detection path for the detection unit a(3, 2) runs through only the front-side jumper wiring layer 3x. The back-side detection path for the detection unit a(3, 2) runs through a part of the back-side electrode layer 2Y and the back-side jumper wiring layer 2y. The front-side detection path for the detection unit a(4, 2) runs through only the front-side jumper wiring layer 4x. The back-side detection path for the detection unit a(4, 2) runs through a part of the back-side electrode layer 2Y and the back-side jumper wiring layer 2y.

Figure 10D:
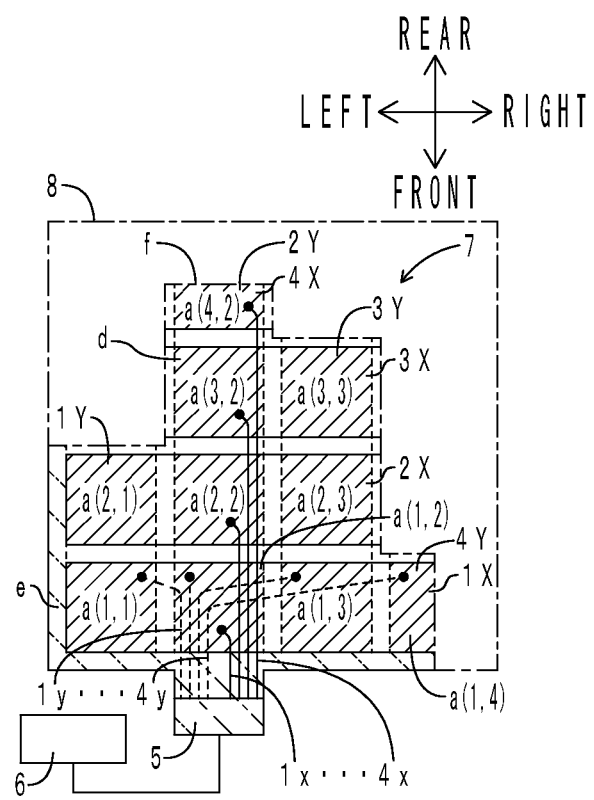
Figure 12:
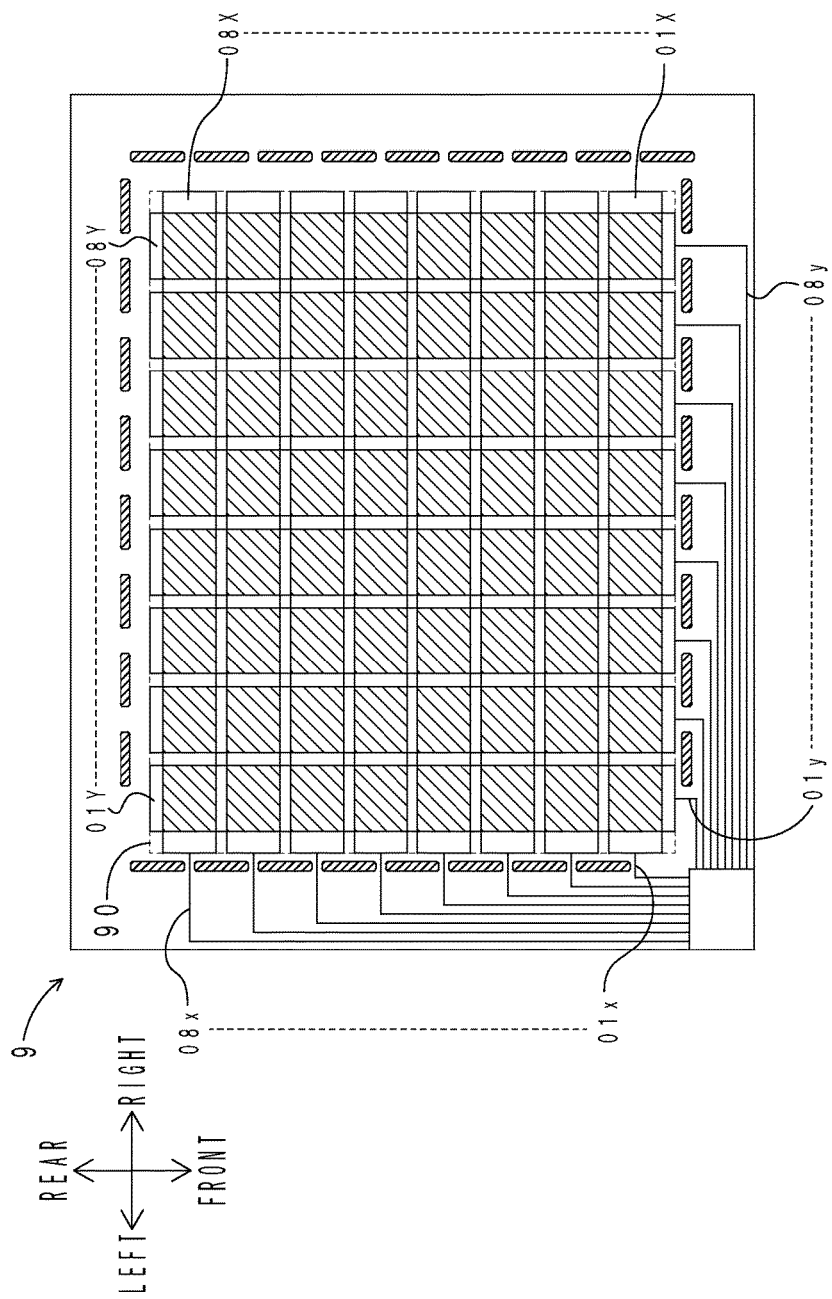
FIG. 12 is a transparent top view of a conventional capacitive sensor.

As shown in FIG. 10D, a capacitive sensor 7 includes a stepped sensor body f cut from the sensor sheet 8 and the control unit 6. The sensor body f includes the detection units a(1, 1) to a(1, 4), a(2, 1) to a(2, 3), a(3, 2), a(3, 3), and a(4, 2), the connector 5, and front-side detection paths and back-side detection paths for the detection units a(1, 1) to a(1, 4), a(2, 1) to a(2, 3), a(3, 2), a(3, 3), and a(4, 2). The front-side detection paths and the back-side detection paths for the detection units a(1, 1) to a(1, 4) are similar to those in FIG. 10B. The front-side detection paths and the back-side detection paths for the detection units a(2, 2), a(3, 2), and a(4, 2) are similar to those in FIG. 10C. The front-side detection path for the detection unit R(7, 1) rung through a part of the front-side electrode layer 2X and the front-side jumper wiring layer 2x. The back-side detection path for the detection unit a(2, 1) runs through a part of the back-side electrode layer 1Y and the back-side jumper wiring layer 1y. The front-side detection path for the detection unit a(2, 3) runs through a part of the front-side electrode layer 2X and the front-side jumper wiring layer 2x. The back-side detection path for the detection unit a(2, 3) runs through a part of the back-side electrode layer 3Y and the back-side jumper wiring layer 3y. The front-side detection path for the detection unit a(3, 3) runs through a part of the front-side electrode layer 3X and the front-side jumper wiring layer 3x. The back-side detection path for the detection unit a(3, 3) runs through a part of the back-side electrode layer 3Y and the back-side jumper wiring layer 3y.

The detection units a(1, 4), a(4, 2) have been partially cut away. The control unit 6 corrects the amount of electricity (e.g., a voltage, a current, etc.) regarding capacitance of the detection unit a(1, 4), according to the electrode area of a part of the front-side electrode layer 1X and a part of the back-side electrode layer 1Y which form the detection unit a(1, 4). Similarly, the control unit 6 corrects the amount of electricity regarding capacitance of the detection unit a(4, 2), according to the electrode area of a part of the front-side electrode layer 1X and a part of the back-side electrode layer 1Y which form the detection unit a(4, 2).

<Methods for Manufacturing Sensor Sheet and Capacitive Sensor>

Methods for manufacturing the sensor sheet and the capacitive sensor of the present embodiment will be described. The method for manufacturing the sensor sheet of the present embodiment includes an electrode unit producing step and a placing step. That is, the method for manufacturing the sensor sheet of the present embodiment is similar to the method for manufacturing the capacitive sensor of the first embodiment. The method for manufacturing the capacitive sensor of the present embodiment includes the method for manufacturing the sensor sheet and a cutting step. In the cutting step, as shown in FIGS. 10A to 10D, the sensor body f with a desired shape etc. is cut from the sensor sheet 8 shown in FIG. 6. Operation of the capacitive sensor 7 of the present embodiment is similar to that of the capacitive sensor of the first embodiment.

<Functions and Effects of Sensor Sheet, Capacitive Sensor, and Methods for Manufacturing Sensor Sheet and Capacitive Sensor>

Functions and effects of the sensor sheet, the capacitive sensor, and the methods for manufacturing the sensor sheet and the capacitive sensor according to the present embodiment will be described. Regarding those portions having the same configurations, functions and effects of the sensor sheet, the capacitive sensor, and the methods for manufacturing the sensor sheet and the capacitive sensor according to the present embodiment are similar to those of the capacitive sensor and the method for manufacturing the same according to the first embodiment.

As shown in FIGS. 10A to 10D, the sensor body f includes at least one detection unit a(1, 1) to a(4, 4), the connector 5, and the front-side detection path b and the back-side detection path c for the detection unit a(1, 1) to a(4, 4) (see FIG. 6). In the cutting step, the sensor body f with a desired shape, namely the capacitive sensor 7, can be cut from the sensor sheet 8 with a predetermined shape etc. (shared sensor sheet 8 with a fixed shape). Accordingly, even when a plurality of capacitive sensors 7 with different shapes etc. are required, it is not necessary to design and produce dedicated members for the capacitive sensors 7 (e.g., printing plates in the case where the capacitive sensors 7 are manufactured by printing, molds in the case where the capacitive sensors 7 are manufactured by molding, etc.) according to the desired shapes etc. of the capacitive sensors 7. That is, in the cutting step, the sensor bodies f need only be cut from the sensor sheet 8 according to the desired shapes etc. of the capacitive sensors 7. Manufacturing cost of the capacitive sensors 7 can thus be reduced. In particular, manufacturing cost can be reduced in the case of manufacturing many models of capacitive sensors 7 in small quantities or in the case of manufacturing prototypes of the capacitive sensors 7.

As shown in FIGS. 6 to 9, according to the sensor sheet 8 of the present embodiment, the front-side jumper wiring layers 1x to 4x are connected from above to the front-side electrode layers 1X to 4X via the through holes 310. Similarly, the back-side jumper wiring layers 1y to 4y are connected from below to the back-side electrode layers 1Y to 4Y via the through holes 410. As shown in FIGS. 10A to 10D, the sensor body f cut from the sensor sheet 8 is therefore less likely to have a detection unit a(1, 1) to a(4, 4) that cannot detect a load. Flexibility in designing the cut shape of the sensor body f in the cutting step can thus be increased.

As shown in FIGS. 7 to 9, according to the sensor sheet 8 of the present embodiment, the front-side jumper wiring layers 1x to 4x and the front-side electrode layers 1X to 4X can be disposed so that the front-side jumper wiring layers 1x to 4x overlap the front-side electrode layers 1X to 4X in the up-down direction with the front-side insulating layer 31 interposed therebetween. Similarly, the back-side jumper wiring layers 1y to 4y and the back-side electrode layers 1Y to 4Y can be disposed so that the back-side jumper wiring layers 1y to 4y overlap the back-side electrode layers 1Y to 4Y in the up-down direction with the back-side insulating layer 41 interposed therebetween. As shown in FIG. 6, the proportion (proportion of the area) of the dead region e to the entire sensor sheet 8 can thus be reduced. That is, as shown in FIGS. 10A to 10D, the proportion (rate of area) of the dead region e to the entire sensor body f cut from the sensor sheet 8 can be reduced.

As shown by black dots in FIG. 6, the four back-side contacts are disposed so as to overlap the front-side electrode layer 1X closest to the connector 5 as viewed from above, and the four front-side contacts are disposed so as to overlap the back-side electrode layer 2Y closest to the connector 5 as viewed from above. The front-side jumper wiring layers 1x to 4x and the back-side jumper wiring layers 1y to 4y can thus be disposed near the connector 5. Accordingly, as shown in FIGS. 10A to 10D, the front-side jumper wiring layers 1x to 4x and the back-side jumper wiring layers 1y to 4y are less likely to be cut when the sensor body f is cut from the sensor sheet 8 in the cutting step. Flexibility in designing the cut shape of the sensor body f can thus be increased.

As shown in FIG. 10D, according to the capacitive sensor 7 of the present embodiment, in the case where the sensor body f cut from the sensor sheet 8 has the partially cut away detection units a(1, 4), a(4, 2), the control unit 6 can correct the amount of electricity regarding capacitance of the detection units a(1, 4), a(4, 2). Accuracy of detection of load distribution can thus be improved.

The dielectric layer 2 is made of urethane foam. The front-side substrate 30 and the back-side substrate 40 are made of PET. The front-side insulating layer 31 and the back-side insulating layer 41 contain urethane rubber. The front-side jumper wiring layers 1x to 4x, the back-side jumper wiring layers 1y to 4y, the front-side electrode layers 1X to 4X, and the back-side electrode layers 1Y to 4Y contain acrylic rubber. The front-side protective layer 32 and the back-side protective layer 42 are made of urethane rubber. The members forming the sensor sheet 8 can thus be manufactured with foam, an elastomer, and a material containing an elastomer as a base material. The sensor sheet 8 is therefore flexible. Accordingly, the sensor sheet 8 can be easily cut with a cutting instrument (a cutter, scissors, etc.) in the cutting step.

Third Embodiment

A sensor sheet of the present embodiment is different from the sensor sheet of the second embodiment in that front-side contacts and back-side contacts are individually placed in all detection units. Only the differences from the second embodiment will be described below.

FIG. 11 is a transparent top view of the sensor sheet of the present embodiment. In FIG. 11, portions corresponding to those in FIG. 6 are denoted with the same reference characters as those in FIG. 6. Front-side electrode layers 1X to 3X and front-side jumper wiring layers 1$x$ to 3$x$ are shown by solid lines, back-side electrode layers 1Y to 3Y and back-side jumper wiring layers 1$y$ to 3$y$ are shown by dotted lines, and front-side contacts and back-side contacts are shown by black dots.

As shown in FIG. 11, the front-side jumper wiring layer 1$x$ includes a main line portion 1$x$0 and three branch line portions 1$x$1 to 1$x$3. The main line portion 1$x$0 has its one end electrically connected to a connector 5. The branch line portions 1$x$1 to 1$x$3 branch off from the other end of the main line portion 1$x$0. The branch line portions 1$x$1 to 1$x$3 electrically connect the main line portion 1$x$0 to the detection units a(1, 1) to a(1, 3). The same applies to the remaining front-side jumper wiring layers 2$x$, 3$x$ and the back-side jumper wiring layers 1$y$ to 3$y$. As described above, any single front-side jumper wiring layer 1$x$ to 3$x$ is branched and connected to a single front-side electrode layer 1X to 3X via a plurality of front-side contacts, and any single back-side jumper wiring layer 1$y$ to 3$y$ is branched and connected to a single back-side electrode layer 1Y to 3Y via a plurality of back-side contacts.

A front-side detection path, which runs through only a corresponding one of the front-side jumper wiring layers 1$x$ to 3$x$, is formed between a desired one of the detection units a(1, 1) to a(3, 3) and the connector 5. Similarly, a back-side detection path, which runs through only a corresponding one of the back-side jumper wiring layers 1$y$ to 3$y$, is formed between a desired one of the detection units a(1, 1) to a(3, 3) and the connector 5.

Regarding those portions having the same configurations, functions and effects of a sensor sheet 8 of the present embodiment are similar to those of the sensor sheet of the second embodiment. According to the sensor sheet 8 of the present embodiment, all of the detection units a(1, 1) to a(3, 3) are directly connected to the front-side jumper wiring layers 1$x$ to 3$x$ and the back-side jumper wiring layers 1$y$ to 3$y$. Accordingly, even if any of the front-side electrode layers 1X to 3X and the back-side electrode layers 1Y to 3Y is cut when a sensor body f is cut from the sensor sheet 8, the front-side detection paths and the back-side detection paths for the detection units a(1, 1) to a(3, 3) of the sensor body f can be more easily ensured.

(Other Configurations)

The embodiments of the capacitive sensor, the sensor sheet, and the method for manufacturing, the capacitive sensor according to the present invention are described above. However, the present invention is not limited to the above embodiments. Various modifications or improvements can be made to the above embodiments without departing from the spirit and scope of the invention.

The manner in which the electrode layers and the jumper wiring layers are arranged in the electrode unit is not particularly limited. That is, the electrode layers having a desired size and shape may be arranged in that the jumper wiring layers are connected to desired parts of the electrode layers with the insulating layer interposed therebetween. At least one detection unit need only be formed by the electrode layers overlapping each other in the front-back direction with the dielectric layer interposed therebetween. In the above embodiments, the electrode layers and the jumper wiring layers are disposed in this order from the dielectric layer side. However, the order in which the electrode layers and the jumper wiring layers are stacked may be reversed. That is, the jumper wiring layers and the electrode layers may be disposed in this order from the dielectric layer side. In the above embodiments, each jumper wiring layer consists of two layers, namely the first wiring layer and the second wiring layer. However, each jumper wiring layer may consist of one layer or three or more layers. In the case where each jumper wiring layer consists of a plurality of layers, conductive properties of the jumper wiring layers can be ensured and durability can also be improved by making one of the layers more conductive and the remainder more flexible. In this case, the order in which the plurality of layers are stacked is not limited.

In the above embodiments, each electrode unit is produced by forming the electrode layers etc. on the substrate. However, each electrode unit may be produced by directly forming the electrode layers etc. on the dielectric layer. That is, each electrode unit may be produced by forming the electrode layers, the insulating layer, the jumper wiring layers, etc. on both front and back surfaces of the dielectric layer. In the above embodiments, each electrode unit includes the protective layer. However, the protective layer is not necessarily required.

In the above embodiments, all of the electrode layers, the insulating layer, jumper wiring layers, and the protective layer are formed by screen printing. However, the method for forming these layers is not limited to screen printing. These layers may be formed by any other printing method such as inkjet printing, flexography, gravure, pad printing, or lithography, a transfer method, etc.

The material of the insulating layer of each electrode unit is not particularly limited as long as the insulating layer has an elongation at break of 60% or more, a tension set of less than 5%, and a volume resistivity of $1.0 \times 10^{10}$ Ω·cm or more. For example, the insulating layer may contain an elastomer such as urethane rubber, acrylic rubber, or polyester elastomer. In this case, it is desirable that the insulating layer further contain an anti-blocking agent in order to adjust tackiness of the coating material for forming the insulating layer and the tensile modulus of the insulating layer to restrain the coating film from sticking to the printing plate during printing. Examples of the anti-blocking agent include titanium oxide particles, silica particles, and calcium carbonate particles. It is desirable that the content of the anti-blocking agent be 18 parts by mass or more per 100 parts by mass of the elastomer. In view of extensibility of the insulating layer and adhesion of the insulating layer to a mating member, it is desirable that the content of the anti-blocking agent be less than 107 parts by mass per 100 parts by mass of the elastomer. The content of the anti-blocking agent is more preferably 100 parts by mass or less, and even more preferably 80 parts by mass or less, per 100 parts by mass of the elastomer.

In order to further improve durability after repeated extension and contraction, the tension set of the insulating layer is preferably 4% or less, more preferably 3% or less, and even more preferably 2.5% or less. In order to restrain the coating film from sticking to the printing plate during printing, it is desirable that the insulating layer have a tensile modulus of greater than 10 MPa. The tensile modulus of the insulating layer is preferably 11 MPa or more, and more preferably 16 MPa or more.

Since the electrode layers are flexible and extendable and contractible, the electrode layers contain an elastomer and a conductive material. Preferred examples of the elastomer include urethane rubber, acrylic rubber, silicone rubber, ethylene-propylene copolymer rubber, natural rubber, styrene-butadiene copolymer rubber, acrylonitrile-butadiene copolymer rubber (nitrile rubber), epichlorohydrin rubber, chlorosulfonated polyethylene, and chlorinated polyethylene. The conductive material is selected as appropriate from metal particles of silver, gold, copper, nickel, rhodium, palladium, chromium, titanium, platinum, iron, and their alloys, etc., metal oxide particles of zinc oxide, titanium oxide, etc., metal carbide particles of titanium carbonate, etc., metal nanowires of silver, gold, copper, platinum, nickel, etc., and conductive carbon materials such as conductive carbon black, carbon nanotubes, graphite, and graphene. One of these materials may be used alone, or a mixture of two or more of these materials may be used.

Since the jumper wiring layers are also flexible and extendable and contractible, the jumper wiring layers contain an elastomer and a conductive material. Like the electrode layers, preferred examples of the elastomer include urethane rubber, acrylic rubber, silicone rubber, ethylene-propylene copolymer rubber, natural rubber, styrene-butadiene copolymer rubber, nitrile rubber, epichlorohydrin rubber, chlorosulfonated polyethylene, and chlorinated polyethylene. Like the electrode layers, the conductive material is selected as appropriate from metal particles, metal oxide particles, metal carbide particles, metal nanowires, and conductive carbon materials. One of these materials may be used alone, or a mixture of two or more of these materials may be used.

For example, in the case where each jumper wiring layer consists of two wiring layers, it is desirable that the two wiring layers vary in volume resistivity or tensile modulus. For example, the two wiring layers may have different tensile moduli from each other. Specifically, in the case where one of the two wiring layers has a volume resistivity of $5 \times 10^{-2}$ $\Omega \cdot cm$ or less in its natural state (non-extended state), the other wiring layer may have a higher volume resistivity in its natural state than the one wiring layer, such as $1 \times 10^{1}$ $\Omega \cdot cm$ or less. In this case, it is desirable that the difference in volume resistivity between the two wiring layers be five or less orders of magnitude. It is also desirable that the volume resistivity of at least one of the two wiring layers be less likely to increase even when the wiring layer is extended. For example, it is desirable that the tensile modulus of this wiring layer be 50 MPa or less and the volume resistivity of this wiring layer become 10 or less times that in its natural state when this wiring layer is extended to an elongation of 50% from the natural state. With this configuration, even if electrical resistance of one of the wiring layers increases when extended, or even if electrical connection is interrupted due to cracks, electrical connection can be ensured through the other wiring layer whose volume resistivity is less likely to increase. In order to implement such characteristics, the type of base material, the type and content of conductive material are adjusted as appropriate.

Preferred examples of the substrate include resin films of PET, polyethylene naphthalate (PEN), polyimide, polyethylene, etc., elastomer sheets, and stretchable fabric. In view of flexibility, tension set, etc., preferred examples of the protective layer include urethane rubber, acrylic rubber, silicone rubber, ethylene-propylene copolymer rubber, natural rubber, styrene-butadiene copolymer rubber, nitrile rubber, hydrogenated nitrile rubber, epichlorohydrin rubber, chlorosulfonated polyethylene, and chlorinated polyethylene. The materials of the insulating layer, the electrode layers, the jumper wiring layers, etc. may vary between the electrode units.

The dielectric layer is made of an elastomer or resin (including foam) having a relatively high dielectric constant. For example, it is preferable that the dielectric constant be 5 or more (measured at a frequency of 100 Hz). Examples of such an elastomer include urethane rubber, silicone rubber, nitrile rubber, hydrogenated nitrile rubber, acrylic rubber, natural rubber, isoprene rubber, ethylene-propylene copolymer rubber, butyl rubber, styrene-butadiene rubber, fluororubber, epichlorohydrin rubber, chloroprene rubber, chlorinated polyethylene, and chlorosulfonated polyethylene. Examples of such a resin include polyethylene, polypropylene, polyurethane, polystyrene (including crosslinked foamed polystyrene), polyvinyl chloride, a vinylidene chloride copolymer, an ethylene-vinyl acetate copolymer, and an ethylene-vinyl acetate-acrylic acid ester copolymer.

The shape etc. of the sensor sheet 8 shown in FIG. 6 is not particularly limited. The sensor sheet 8 may not include the connector 5. In this case, the ends of the front-side jumper wiring layers 1*x* to 4*x* and the ends of the back-side jumper wiring layers 1*y* to 4*y* are included in the concept of the "extended portion" of the present invention. The sensor sheet 8 may include separate connectors for the front-side jumper wiring layers 1*x* to 4*x* and the back-side jumper wiring layers 1*y* to 4*y*, namely a dedicated front-side connector for the front-side jumper wiring layers 1*x* to 4*x* and a dedicated back-side connector for the back-side jumper wiring layers 1*y* to 4*y*. In this case, the front-side connector and the back-side connector are included in the concept of the "extended portion" of the present invention. The sensor sheet 8 may not have at least one of the front-side substrate 30, the back-side substrate 40, the front-side protective layer 32, and the back-side protective layer 42.

The number of front-side electrode layers 1X to 4X, the number of back-side electrode layers 1Y to 4Y, the shape etc. of the front-side electrode layers 1X to 4X, and the shape etc. of the back-side electrode layers 1Y to 4Y are not particularly limited. The number of front-side electrode layers 1X to 4X may be different from the number of back-side electrode layers 1Y to 4Y. The shape etc. of the front-side electrode layers 1X to 4X may be different from the shape etc. of the back-side electrode layers 1Y to 4Y. The direction in which the front-side electrode layers 1X to 4X cross the back-side electrode layers 1Y to 4Y is not particularly limited. Any single front-side jumper wiring layer 1*x* to 3*x* may be branched and connected to the plurality of front-side electrode layers 1X to 3X. Any single back-side jumper wiring layer 1*y* to 3*y* may be branched and connected to the plurality of back-side electrode layers 1Y to 3Y.

The number of detection units a(1, 1) to a(4, 4) and the shape etc. of the detection units a(1, 1) to a(4, 4) are not particularly limited. A cut line indicating the shape of the sensor body f that can be cut from the sensor sheet 8 (the shape that can be cut from the sensor sheet 8 so that the front-side detection paths and the back-side detection paths can be formed between every detection unit a(1, 1) to a(4, 4) and the connector 5 of the sensor body f cut from the sensor sheet 8) may be located on the front surface or the back surface of the sensor sheet 8. There is a case where this cut line intersects at least one of the front-side electrode layers 1X to 4X, the front-side jumper wiring layers 1*x* to 4*x*, the back-side electrode layers 1Y to 4Y, and the back-side jumper wiring layers 1y to 4y.

As shown in FIGS. 10A to 10D, at least one of the front-side electrode layers 1X to 4X, the front-side jumper wiring layers 1x to 4x, the back-side electrode layers 1Y to 4Y, and the back-side jumper wiring layers 1y to 4y may partially remain at the outer edge of the sensor body f cut from the sensor sheet 8. By observing this remaining part, it can be checked that the sensor body f has been cut from the sensor sheet 8.

The number of layers (the first wiring layer 33 and the second wiring layer 34) that form each front-side jumper wiring layer 1x to 4x is not particularly limited. Each front-side jumper wiring layer 1x to 4x may consist of a single layer or three or more layers. The same applies to the back-side jumper wiring layers 1y to 4y.

Applications of the sensor body f cut from the sensor sheet of the present invention are not particularly limited. For example, in the case where the sensor body f is wound about a desired part (such as an arm part) of a robot, load distribution in the part having the sensor body f wound thereabout can be measured. In the case where the sensor body f is placed as an insole sensor on the bottom of a shoe, load distribution on the sole can be measured.

EXAMPLES

The present invention will be described more specifically based on examples of the insulating layer of the electrode unit.

Production and Physical Property Measurement of Insulating Layer

First, the following ten types of insulating layers A to J were produced.

[Insulating Layer A]

One hundred parts by mass of urethane rubber polymer (Miractran (registered trademark) E385" made by Nippon Miractran Company Limited) was dissolved in butyl carbitol acetate, which is a solvent, to prepare a urethane rubber solution. To the prepared urethane rubber solution, 54 parts by mass of titanium oxide powder ("JR-805" made by TAYCA CORPORATION), which is an anti-blocking agent, was added and the resultant mixture was stirred to prepare an insulating layer coating material A. The insulating layer coating material A was screen-printed on the surface of a substrate, namely a urethane rubber sheet, and the resultant coating film was cured by heating. The insulating layer A was thus produced.

[Insulating Layer B]

The insulating layer B was produced in a manner similar to that of the insulating layer A except that 27 parts by mass of titanium oxide powder was added to the urethane rubber solution to prepare an insulating layer coating material B.

[Insulating Layer C]

The insulating layer C was produced in a manner similar to that of the insulating layer A except that 80 parts by mass of titanium oxide powder was added to the urethane rubber solution to prepare an insulating layer coating material C.

[Insulating Layer D]

The insulating layer D was produced in a manner similar to that of the insulating layer A except that, instead of the titanium oxide powder, 18 parts by mass of silica powder (ADMAFINE (registered trademark) SO-E3" made by Admatechs Company Limited) was added as an anti-blocking agent to the urethane rubber solution to prepare an insulating layer coating material D.

[Insulating Layer E]

First, 100 parts by mass of an acrylic rubber polymer ("Nipol (registered trademark) AR42W" made by Zeon Corporation), 60 parts by mass of HAF carbon ("SEAST 3" made by TOKAI CARBON CO., LTD.), which is a filler, 1 part by mass of stearate acid (made by NOF CORPORATION) and 1 part by mass of "GLECK (registered trademark) G-8205" (made by DIC Corporation), which are a lubricant, 2 parts by mass of 4,4'-di-(α,α-dimethylbenzyp-diphenylamine ("Naugard 445" made by Crompton Corporation), which is an antioxidant, 2 parts by mass of 1,3-di-o-tolylguanidine ("NOCCELER (registered trademark) DT" made by OUCHI SHINKO CHEMICAL INDUSTRIAL CO., LTD.), which is a vulcanization accelerator, and 0.6 parts by mass of hexamethylene diamine carbamate ("Diak No. 1" made by DuPont), which is a crosslinker, were mixed by a roll mill to prepare an acrylic rubber composition. The acrylic rubber composition thus prepared was then dissolved in butyl carbitol acetate, which is a solvent, to prepare an acrylic rubber solution. To the prepared acrylic rubber solution, 80 parts by mass of titanium oxide powder (same as above) was added, and the resultant mixture was stirred to prepare an insulating layer coating material E. The insulating layer coating material E was screen-printed on the surface of a urethane rubber sheet, which is a substrate. The resultant coating film was cured by heating. The insulating layer E was thus produced.

[Insulating Layer F]

First, 45 parts by mass of "elitel (registered trademark) UE3400" (made by UNITIKA LTD.) and 55 parts by mass of "ARON MELT (registered trademark) PES360HUXM30 (made by TOAGOSEI CO., LTD.), which are polyester elastomer polymers, and 5 parts by mass of "Sumidur (registered trademark) L-75" (made by Sumitomo Bayer Urethane Co., Ltd., which is a crosslinker, were dissolved in butyl carbitol acetate, which is a solvent, to prepare a polyester elastomer solution. To the prepared polyester elastomer solution, 100 parts by mass of titanium oxide powder (same as above) was added and the resultant mixture was stirred with a bead mill to prepare an insulating layer coating material F. The insulating layer coating material F was screen-printed on the surface of a urethane rubber sheet, and the resultant coating film was cured by heating. The insulating layer F was thus produced.

[Insulating Layer G]

The insulating layer G was produced in a manner similar to that of the insulating layer A except that the urethane rubber solution prepared when producing the insulating layer A was used as it was as the insulating layer coating material G The insulating layer G contains no anti-blocking agent.

[Insulating Layer H]

The insulating layer H was produced in a manner similar to that of the insulating layer A except that 107 parts by mass of the titanium oxide powder was added to the urethane rubber solution to prepare an insulating layer coating material H.

[Insulating Layer I]

Commercially available polyester resin-based resist ink ("Dotite (registered trademark) XB-3136" made by FUJI-KURA KASEI CO., LTD., hereinafter referred to as the insulating layer coating material I) was screen-printed on the surface of a urethane rubber sheet, which is a substrate. The resultant coating film was cured by heating. The insulating layer I was thus produced.

[Insulating Layer J]

Commercially available polyester resin-based resist ink ("Dotite XB-101G" made by FUJIKURA KASEI CO., LTD., hereinafter referred to as the insulating layer coating material J) was screen-printed on the surface of a urethane rubber sheet, which is a substrate. The resultant coating film was cured by heating. The insulating layer J was thus produced.

Physical properties of each insulating layer were measured. Details of the physical properties measured and a measurement method are shown below.

[Elongation at Break]

A tensile test defined in JIS K6251:2010 was performed to calculate an elongation at break. Test pieces of dumbbell shape No. 5 were used and a tensile speed was 100 mm/min.

[Tension Set]

A tension set test under constant elongation defined in JIS K6273:2006 was performed to measure a tension set. Test pieces of dumbbell shape No. 5 defined in JIS K6251:2010 were used. The test pieces were extended to an elongation of 50% and were tested at room temperature for 30 seconds.

[Tensile Modulus]

A tensile test defined in JIS K7127:1999 was performed to calculate a tensile modulus based on an obtained stress-elongation curve. Type 2 test pieces were used and a tensile speed was 100 mm/min.

[Volume Resistivity]

Volume resistivity was measured based on a method defined in JIS K6911:1995. A DC voltage of 100 V was applied to measure the volume resistivity.

Table 1 shows main components and physical properties of the insulating layers. In Table 1, the amount of each raw material is shown in parts by mass.

TABLE 1

| | | | Insulating Layer A | Insulating Layer B | Insulating Layer C | Insulating Layer D | Insulating Layer E |
|---|---|---|---|---|---|---|---|
| Raw Materials | Elastomer | Urethane Rubber | 100 | 100 | 100 | 100 | — |
| | | Acrylic Rubber | — | — | — | — | 100 |
| | | Polyester | — | — | — | — | — |
| | Anti-Blocking Agent | Titanium Oxide | 54 | 27 | 80 | — | 80 |
| | | Silica | — | — | — | 18 | — |
| | | Crosslinker | — | — | — | — | 0.6 |
| Physical Properties | | Elongation at Break [%] | 139 | 124 | 65 | 224 | 68 |
| | | Tension Set [%] | 0 | 0 | 2.5 | 0 | 0 |
| | | Tensile Modulus [MPa] | 23 | 16 | 24 | 18 | 17 |
| | | Volume Resistivity [Ω·cm] | $6.3 \times 10^{10}$ | $4.4 \times 10^{11}$ | $3.2 \times 10^{10}$ | $6.1 \times 10^{11}$ | $3.5 \times 10^{10}$ |

| | | | Insulating Layer F | Insulating Layer G | Insulating Layer H | Insulating Layer I | Insulating Layer J |
|---|---|---|---|---|---|---|---|
| Raw Materials | Elastomer | Urethane Rubber | — | 100 | 100 | Polyester Resin | Polyester Resin |
| | | Acrylic Rubber | — | — | — | | |
| | | Polyester | 100 | — | — | | |
| | Anti-Blocking Agent | Titanium Oxide | 100 | — | 107 | — | — |
| | | Silica | — | — | — | — | — |
| | | Crosslinker | 5 | — | — | — | — |
| Physical Properties | | Elongation at Break [%] | 230 | 185 | 57 | 388 | 556 |
| | | Tension Set [%] | 4.5 | 0 | 5 | 5 | 12.5 |
| | | Tensile Modulus [MPa] | 620 | 10 | 48 | 150 | 700 |
| | | Volume Resistivity [Ω·cm] | $7.1 \times 10^{13}$ | $8.8 \times 10^{11}$ | $1.2 \times 10^{10}$ | $9.7 \times 10^{13}$ | $1.1 \times 10^{14}$ |

As shown in Table 1, in the insulating layers A to F, the content of the anti-blocking agent is 18 parts by mass or more and less than 107 parts by mass. Accordingly, the elongation at break was 60% or more, the tension set was less than 5%, the tensile modulus was greater than 10 MPa, and the volume resistivity was $1.0 \times 10^{10}$ Ω·cm or more. The insulating layer G contains no anti-blocking agent. Accordingly, the elongation at break was 60% or more, the tension set was less than 5%, and the volume resistivity was $1.0 \times 10^{10}$ Ω·cm or more, but the tensile modulus was 10 MPa. The insulating layer H contains 107 parts by mass of the anti-blocking agent. Accordingly, the tensile modulus was greater than 10 MPa and the volume resistivity was $1.0 \times 10^{10}$ Ω·cm or more, but the elongation at break was 57% and the tension set was 5%. The insulating layers I, J contain a resin as a base material and contain no anti-blocking agent. Accordingly, the elongation at break was 60% or more, the tensile modulus was greater than 10 MPa, and the volume resistivity was $1.0 \times 10^{10}$ Ω·cm or more, but the tension set was 5% or more.

Evaluation of Laminates Having Insulating Layer

Laminates of a substrate, a conductive layer, and an insulating layer were produced and durability of each laminate was evaluated. The laminates were produced by the following method. First, a conductive layer coating material was screen-printed on the surface of a urethane rubber sheet with a thickness of 200 μm, which is a substrate. The resultant coating film was cured by heating to produce a conductive layer with a thickness of 10 μm. Next, an insulating layer coating material was screen-printed to the surface of the conductive layer. The resultant coating film was cured by heating to produce an insulating layer.

The conductive layer coating material was prepared as follows. First, 100 parts by mass of an acrylic rubber polymer ("Nipol AR42W" made by Zeon Corporation) and 0.1 parts by mass of ethylenediamine, which is a cross-liker, were mixed by a roll mill to prepare an acrylic rubber composition. Next, the acrylic rubber composition thus prepared was dissolved in butyl carbitol acetate to prepare an acrylic rubber solution. Then, 20 parts by mass of carbon nanotubes ("VGCF (registered trademark) made by SHOWA DENKO K.K.), which are a conductive material, and 17 parts by mass of conductive carbon black ("Ketchen Black EC300JD" made by Lion Corporation) were added to the prepared acrylic rubber solution, and the resultant mixture was stirred. The conductive layer corresponds to the electrode layer or the jumper wiring layer in the present invention.

The insulating layer coating materials A to J described above were used as insulating layer coating materials. The insulating layers A to H had a thickness of 40 μm, the insulating layer I had a thickness of 32 μm, and the insulating layer J had a thickness of 28 μm.

The laminates of a substrate, a conductive layer, and an insulating layer thus produced were punched to produce test pieces of dumbbell No. 2 defined in JIS K6251:2010. An extension/contraction resistance test was performed for the test pieces. Specifically, the test pieces were extended and contracted in their longitudinal direction to check if there was delamination of the insulating layer and to measure a change in electrical resistance of the conductive layer. The extension/contraction resistance test was performed by the following method.

First, terminals made of copper foil were placed on exposed portions of the conductive layer which are disposed at both longitudinal ends of the test piece. Next, an electrical resistance measuring device is connected to the terminals, and both of the longitudinal ends of the test piece were held by a pair of jigs. Thereafter, one of the jig is fixed and the other is reciprocated at 80 mm/sec to extend and contract the laminate. When the laminate was extended to the maximum, the elongation was 50% (the laminate being 1.5 times as long as in its natural state). The laminate was extended 25,000 times. Whether there was delamination of the insulating layer or not was visually checked after the test, and the electrical resistance of the laminate before the test (natural state) and the electrical resistance of the laminate extended to the elongation of 50% were measured. Table 2 shows the configurations of the laminates and their evaluation results. In Table 2, the letters for the laminates correspond to the letters for the insulating layers.

TABLE 2

|  |  | Laminate A | Laminate B | Laminate C | Laminate D | Laminate E |
|---|---|---|---|---|---|---|
| Type of Insulating Layer Forming Laminate (Substrate/Conductive Layer/Insulating Layer) | | A | B | C | D | E |
| Physical Properties of Insulating Layer | Elongation at Break [%] | 139 | 124 | 65 | 224 | 68 |
| | Tension Set [%] | 0 | 0 | 2.5 | 0 | 0 |
| Evaluation of Laminate | Delamination of Insulating Layer | None | None | None | None | None |
| | Electrical Resistance in Natural State [Ω] | $5.0 \times 10^2$ | $5.0 \times 10^2$ | $5.0 \times 10^2$ | $5.0 \times 10^2$ | $5.0 \times 10^2$ |
| | Electrical Resistance after Extension/ Contraction Resistance Test [Ω] | $2.5 \times 10^3$ | $2.4 \times 10^3$ | $2.2 \times 10^3$ | $2.7 \times 10^3$ | $2.1 \times 10^3$ |

|  |  | Laminate F | Laminate G | Laminate H | Laminate I | Laminate J |
|---|---|---|---|---|---|---|
| Type of Insulating Layer Forming Laminate (Substrate/Conductive Layer/Insulating Layer) | | F | G | H | I | J |
| Physical Properties of Insulating Layer | Elongation at Break [%] | 230 | 185 | 57 | 388 | 556 |
| | Tension Set [%] | 4.5 | 0 | 5 | 5 | 12.5 |
| Evaluation of Laminate | Delamination of Insulating Layer | None | None | Yes | Yes | Yes |
| | Electrical Resistance in Natural State [Ω] | $5.0 \times 10^2$ | $5.0 \times 10^2$ | $5.0 \times 10^2$ | $5.0 \times 10^2$ | $5.0 \times 10^2$ |
| | Electrical Resistance after Extension/ Contraction Resistance Test [Ω] | $2.8 \times 10^3$ | $2.2 \times 10^3$ | $3.6 \times 10^3$ | $6.9 \times 10^3$ | $1.2 \times 10^4$ |

As shown in Table 2, in the laminates A to G, the insulating layer had an elongation at break of 60% or more and a tension set of less than 5%. Accordingly, delamination of the insulating layer didn't occur even after repeated extension and contraction, and the electrical resistance of the conductive layer did not increase so much. In the laminate H, however, the insulating layer had an elongation at break of less than 60% and a tension set of 5%. Accordingly, the insulating layer of the laminate H delaminated after repeated extension and contraction, and the electrical resistance of the conductive layer increased as compared to the laminates A to G. In the laminates I, J, the insulating layer had an elongation at break of 60% or more, but had a tension set of 5% or more. Therefore, delamination of the insulating layer occurred after repeated extension and contraction and the electrical resistance of the conductive layer increased significantly as compared to the laminates A to G.

<Evaluation of Blocking Resistance of Insulating Layers>

Blocking resistance (tackiness) of the produced insulating layers was evaluated. The evaluation method is as follows.

An insulating layer coating material was screen-printed and the resultant coating film was cured by heating to produce an insulating layer. The insulating layer thus produced was allowed to stand at room temperature for 24 hours. The surface of the insulating layer was then touched with finger. The insulating layer was evaluated to have satisfactory resistance to blocking (shown by 0 in Table 3) if the surface of the insulating layer was not sticky. The insulating layer was evaluated to have unsatisfactory resistance to blocking (shown by X in Table 3) if the surface of the insulating layer was sticky. FIG. 3 shows the evaluation results. As in Table 1, the amount of each raw material is shown in parts by mass in Table 3.

TABLE 3

| Insulating Layers | | | Insulating Layer A | Insulating Layer B | Insulating Layer C | Insulating Layer D | Insulating Layer E |
|---|---|---|---|---|---|---|---|
| Raw Materials | Elastomer | Urethane Rubber | 100 | 100 | 100 | 100 | — |
| | | Acrylic Rubber | — | — | — | — | 100 |
| | | Polyester | — | — | — | — | — |
| | Anti-Blocking Agent | Titanium Oxide | 54 | 27 | 80 | — | 80 |
| | | Silica | — | — | — | 18 | — |
| | | Crosslinker | — | — | — | — | 0.6 |
| Physical Properties Evaluation | Tensile Modulus [MPa] | | 23 | 16 | 24 | 18 | 17 |
| | Blocking Resistance (Tackiness) | | ○ | ○ | ○ | ○ | ○ |

| Insulating Layers | | | Insulating Layer F | Insulating Layer G | Insulating Layer H | Insulating Layer I | Insulating Layer J |
|---|---|---|---|---|---|---|---|
| Raw Materials | Elastomer | Urethane Rubber | — | 100 | 100 | Polyester Resin | Polyester Resin |
| | | Acrylic Rubber | — | — | — | | |
| | | Polyester | 100 | — | — | | |
| | Anti-Blocking Agent | Titanium Oxide | 100 | — | 107 | — | — |
| | | Silica | — | — | — | — | — |
| | | Crosslinker | 5 | — | — | — | — |
| Physical Properties Evaluation | Tensile Modulus [MPa] | | 620 | 10 | 48 | 150 | 700 |
| | Blocking Resistance (Tackiness) | | ○ | X | ○ | ○ | ○ |

As shown in Table 3, the insulating layers A to F, H to J had a tensile modulus of greater than 10 MPa. Accordingly, the surfaces of the insulating layers A to F, H to J were not sticky and the insulating layers A to F, H to J had satisfactory resistance to blocking. However, the insulating layer G had a tensile modulus of 10 MPa. Accordingly, the surface of the insulating layer G was sticky, and the coating film tended to stick to the printing plate when screen-printed, as compared to the other insulating layers.

<Summary>

The values of the elongation at break and the tension set of the insulating layers A to F are included in the scope of the present invention. In this respect, the insulating layers A to F are included in the insulating layer forming the capacitive sensor of the present invention. The insulating layers A to F had satisfactory blocking resistance, and high durability was achieved in the case where the laminate was formed by using any of the insulating layers A to F. The values of the elongation at break and the tension set of the insulating layer H do not meet the scope of the present invention. The values of the tension set of the insulating layers I, J do not meet the scope of the present invention. In this respect, the insulating layers H, I, J are not included in the insulating layer forming the capacitive sensor of the present invention. Durability after repeated extension and contraction was not sufficient in the case where the laminate was formed by using any of the insulating layers H, I, J. The values of the elongation at break and the tension set of the insulating layer G are included in the scope of the present invention. In this respect, the insulating layer G is included in the insulating layer forming the capacitive sensor of the present invention. High durability was achieved in the case where the laminate was formed by using the insulating layer G. However, since the tensile modulus of the insulating layer was not greater than 10 MPa, the insulating layer G did not have sufficient blocking resistance.

The capacitive sensor of the present invention can be used as a flexible load sensor that is placed in an automobile seat, a wheelchair, a mattress, a carpet, etc. The capacitive sensor of the present invention can also be used as an artificial skin, a motion capture that detects human movements, and an information input device such as a keyboard. In particular, the capacitive sensor of the present invention is preferably used in applications in which the size and shape of the sensor are limited, such as a sensor that is placed inside a shoe to measure foot pressure distribution.

What is claimed is:

1. A capacitive sensor comprising:
   a dielectric layer; and
   a plurality of electrodes placed on both sides of the dielectric layer in a front-back direction, wherein
   each of the electrodes includes an insulating layer having a through hole extending therethrough in the front-back direction, an electrode layer placed on one side of the insulating layer in the front-back direction, and a jumper wiring layer placed on the other side of the insulating layer in the front-back direction and electrically connected to the electrode layer through the through hole, and
   the insulating layer has an elongation at break of 60% or more and a tension set of less than 5%, and a volume resistivity of $1.0 \times 10^{10}$ Ω·cm or more.

2. The capacitive sensor according to claim 1, wherein the insulating layer has a tensile modulus of greater than 10 MPa.

3. The capacitive sensor according to claim 1, wherein the insulating layer contains an elastomer and an anti-blocking agent.

4. The capacitive sensor according to claim 3, wherein the insulating layer contains 18 parts by mass or more and less than 107 parts by mass of the anti-blocking agent per 100 parts by mass of the elastomer.

5. The capacitive sensor according to claim 3, wherein the anti-blocking agent contains at least either titanium oxide particles or silica particles.

6. The capacitive sensor according to claim 1, wherein the electrode has a substrate, and
the insulating layer, the electrode layer, and the jumper wiring layer are formed on one side of the substrate in the front-back direction.

7. The capacitive sensor according to claim 1, wherein the electrode layer and the jumper wiring layer contain an elastomer.

8. The capacitive sensor according to claim 1, wherein the electrode placed on a front side of the dielectric layer is a front-side electrode, and the electrode placed on a back side of the dielectric layer is a back-side electrode unit,
in the front-side electrode, the electrode layer is formed by a plurality of front-side electrode layers arranged parallel to each other, and the jumper wiring layer is formed by a plurality of front-side wiring layers electrically connected to the plurality of front-side electrode layers,
in the back-side electrode, the electrode layer is formed by a plurality of back-side electrode layers arranged parallel to each other, and the jumper wiring layer is formed by a plurality of back-side wiring layers electrically connected to the plurality of back-side electrode layers, and
the plurality of front-side electrode layers and the plurality of back-side electrode layers extend in such a direction that the plurality of front-side electrode layers cross the plurality of back-side electrode layers, and a plurality of detection circuits are formed in portions where the plurality of front-side electrode layers overlap the plurality of back-side electrode layers, as viewed from a front side or a back side.

9. A method for manufacturing the capacitive sensor according to claim 6, the method comprising:
producing the electrode; and
placing the electrode on both sides of the dielectric layer in the front-back direction such that the substrate faces outward, wherein
the producing of the electrode includes
forming one of the electrode layer and the jumper wiring layer on one side of the substrate in the front-back direction by a printing method,
forming the insulating layer by a printing method such that the insulating layer covers the printed electrode layer or jumper wiring layer, and
forming the other of the electrode layer and the jumper wiring layer by a printing method such that the other of the electrode layer and the jumper wiring layer covers the through hole in the insulating layer.

10. The method according to claim 9, wherein
the printing method used in the forming of the one of the electrode layer and the jumper wiring layer is screen printing,
the printing method used in the forming of the insulating layer is screen printing, and
the printing method used in the forming of the other of the electrode layer and the jumper wiring layer is screen printing.

11. A sensor sheet including the capacitive sensor according to claim 8, comprising, as viewed from a front side or a back side:
a pressure sensitive region where the plurality of detecting circuits are formed; and
a dead region placed next to the pressure sensitive region in a planar direction, and having an extended portion from which an amount of electricity regarding capacitance of the plurality of detection circuits can be obtained from outside,
the insulating layer of the front-side electrode is a front-side insulating layer placed on a front side of the front-side electrode layer,
the through hole extending through the front-side insulating layer is a front-side through hole,
the insulating layer of the back-side electrode is a back-side insulating layer placed on a back side of the back-side electrode layer,
the through hole extending through the back-side insulating layer is a back-side through hole,
the front-side wiring layer is placed on a front side of the front-side insulating layer and electrically connects the front-side electrode layer and the extended portion via the front-side through hole,
the back-side wiring layer is placed on a back side of the back-side insulating layer and electrically connects the back-side electrode layer and the extended portion via the back-side through hole,
a front-side detection path running through at least the front-side wiring layer and a back-side detection path running through at least the back-side wiring layer are formed between each of the plurality of detection circuits and the extended portion, and
a sensor body having at least one of the detection circuits, the extended portion, and the front-side detection path and the back-side detection path for the detection circuit is allowed to be cut from the sensor sheet.

12. The sensor sheet according to claim 11, wherein
a contact between the front-side wiring layer and the front-side electrode layer is a front-side contact, and a contact between the back-side wiring layer and the back-side electrode layer is a back-side contact,
a plurality of the back-side contacts are placed so as to overlap the front-side electrode layer closest to the extended portion, as viewed from the front side or the back side, and
a plurality of the front-side contacts are placed so as to overlap the back-side electrode layer closest to the extended portion, as viewed from the front side or the back side.

13. The sensor sheet according to claim 11, wherein
a contact between the front-side wiring layer and the front-side electrode layer is a front-side contact, and a contact between the back-side wiring layer and the back-side electrode layer is a back-side contact, and
the front-side contact and the back-side contact are individually placed in all of the detection circuits.

14. A capacitive sensor, comprising:
a sensor body cut from the sensor sheet according to claim 11; and
a control circuit that is electrically connected to the extended portion and that, in a case where the sensor body has the detection circuit that has been partially cut away, corrects the amount of electricity regarding the capacitance of the detection circuit.

15. A method for manufacturing the capacitive sensor according to claim 14, the method comprising:
cutting the sensor body from the sensor sheet.

* * * * *